US006373418B1

(12) United States Patent
Abbey

(10) Patent No.: US 6,373,418 B1
(45) Date of Patent: Apr. 16, 2002

(54) NYQUIST RESPONSE RESTORING DELTA-SIGMA MODULATOR BASED ANALOG TO DIGITAL AND DIGITAL TO ANALOG CONVERSION

(75) Inventor: Duane L. Abbey, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 09/579,025

(22) Filed: May 25, 2000

(51) Int. Cl.[7] ................................................ H03M 3/00
(52) U.S. Cl. ...................... 341/143; 341/144; 341/155
(58) Field of Search ................................. 341/143, 144, 341/155

(56) References Cited

U.S. PATENT DOCUMENTS

| 5,153,593 A | * | 10/1992 | Walden et al. | ............... 341/143 |
| 5,446,460 A | * | 8/1995 | Cabler | ........................ 341/143 |
| 5,500,645 A | * | 3/1996 | Ribner et al. | ............... 341/143 |
| 5,778,310 A | * | 7/1998 | Tong et al. | ................. 455/306 |
| 6,061,008 A |   | 5/2000 | Abbey | ........................ 341/143 |
| 6,188,345 B1 | * | 2/2001 | McDonald et al. | ......... 341/143 |
| 6,225,928 B1 | * | 5/2001 | Green | ........................ 341/143 |

OTHER PUBLICATIONS

Analog Devices, AD9042, 12–Bit, 41 MSPS Monolithic A/D Converter, Data Sheet, Analog Devices, Inc., Rev. A, 1996.
Analog Devices, AD9225, Complete 12–Bit, 25 MSPS Monolithic A/D Converter, Data Sheet, Analog Devices, Inc., Rev. A, 1998.
Analog Devices, AD9221/AD9223/AD9220, Complete 12–Bit, 1.5/3.0/10.0 MSPS Monolithic A/D Converters, Data Sheet, Analog Devices, Inc., Rev. C, 1999.
Analog Devices, AD9203, 10–Bit, 40 MSPS, 3 V, 74 mW A/D Converter, Data Sheet, Analog Devices, Inc., Rev. O, 1999.
Analog Devices, AD9200, Complete 10–Bit, 20 MSPS, 80 mW CMOS A/D Converter, Data Sheet, Analog Devices, Inc., Rev. E, 1999.
Pending patent application Docket No. 99CR013/KE entitled "Multi–Bit Monotonic Quantizer And Linearized Delta–Sigma Modulator Based Analog–To–Digital And Digital–To Analog Conversion" filed Aug. 26, 1999, with S/N 09/383,305, inventor D. Abbey.
Pending patent application Docket No. 99CR014/KE entitled "High Performance Digma–Selta–Sigma Low–Pass/Band–Pass Modulator Based Analog–To–Digital And Digital–To Analog Converter" filed Aug. 26, 1999, with S/N 09/384,002, inventor D. Abbey.
Analog Devices, AD6644, 14–Bit, 40 MSPS/65 A/D Converter, Data Sheet, Analog Devices, Inc., Rev. O.
Analog Devices, AD9241, Complete 14–Bit, 1.25 MSPS Monolithic A/D Converter, Data Sheet, Analog Devices, Inc., Rev. O, 1997.

* cited by examiner

*Primary Examiner*—Peguy JeanPierre
(74) *Attorney, Agent, or Firm*—Nathan O. Jensen; Kyle Eppele

(57) ABSTRACT

A high pass delta-sigma modulator apparatus is disclosed for use in analog-to-digital and digital-to-analog converters. The apparatus includes a signal input, a differentiator component, a signal transducer producing an output signal, an inverse signal transducer producing an input compatible feedback signal, and a feedback loop coupling a feedback signal back to said differentiator component. Also disclosed is a Nyquist response restoring delta-sigma modulator based analog-to-digital and digital-to-analog converter apparatus having a first modulator set, a first scaling component, a second modulator set and a post processing combiner. In the various embodiments, the modulator sets can include an analog signal input, a digital signal input, a quantizer, a digital resolution rounder, a digital resolution truncator, a digital-to-analog signal transducer, a digital resolution expander, a delta sigma modulator structure, a feedback structure, an analog signal output, and one or more digital signal outputs.

30 Claims, 12 Drawing Sheets

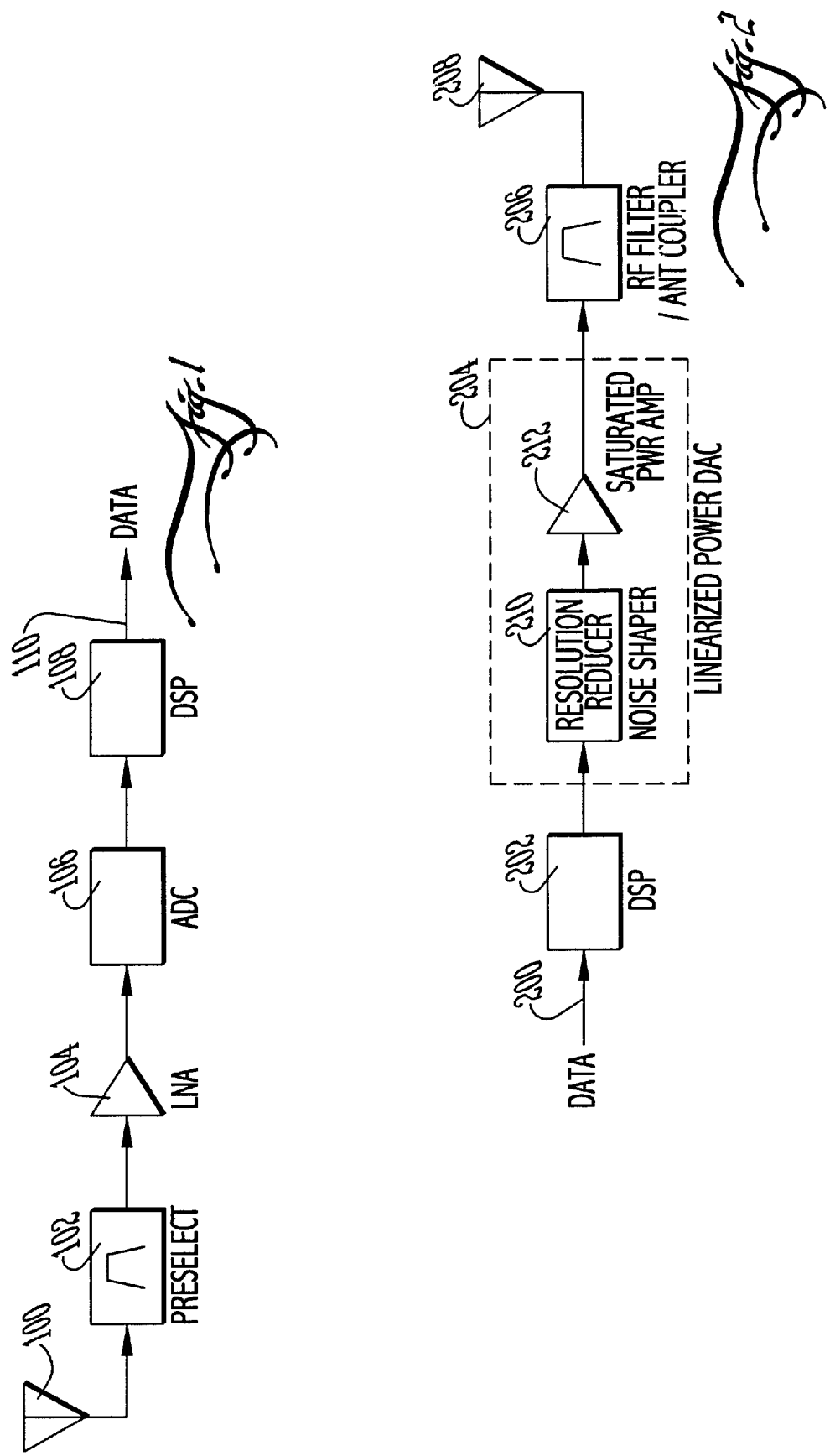

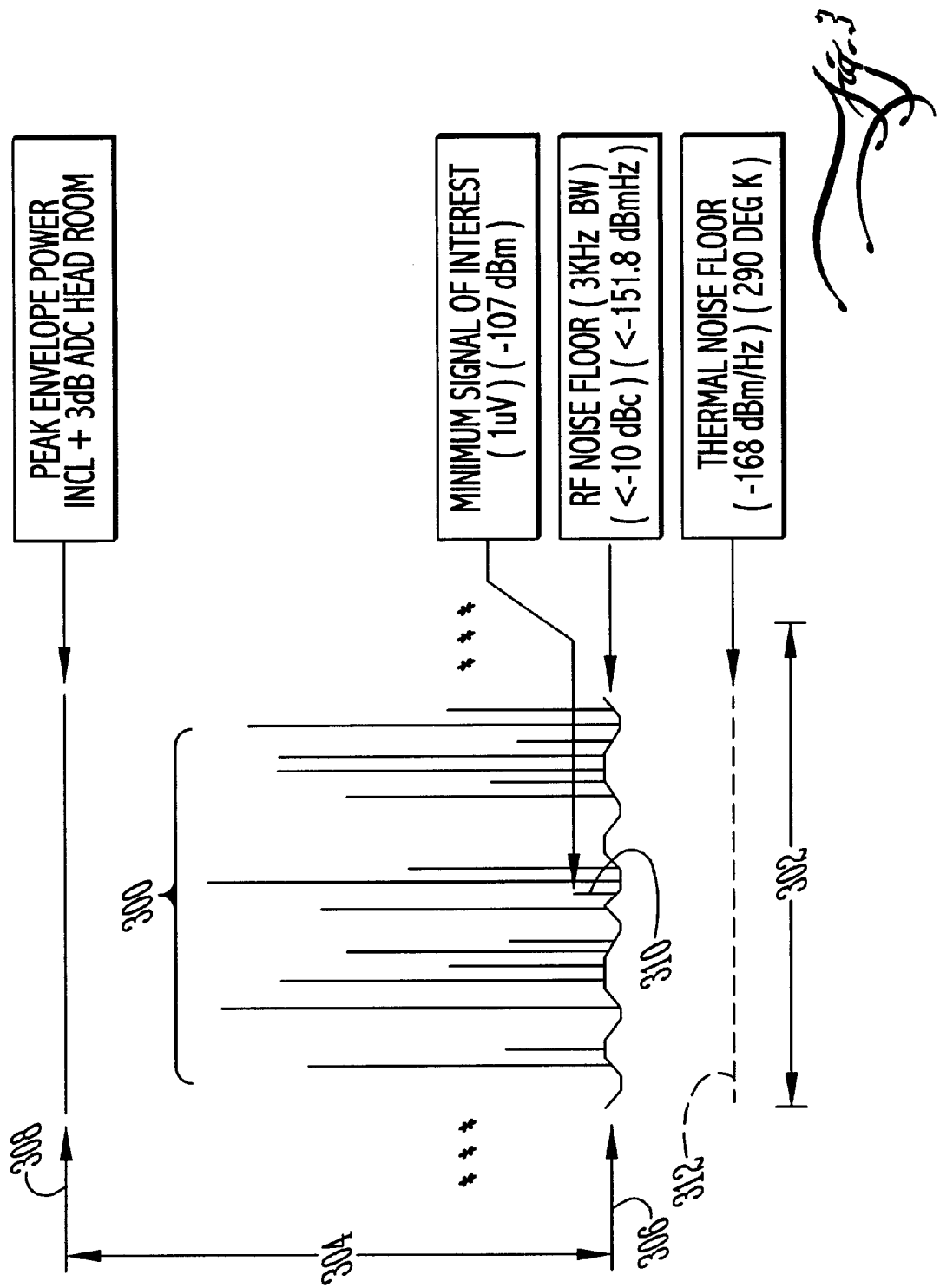

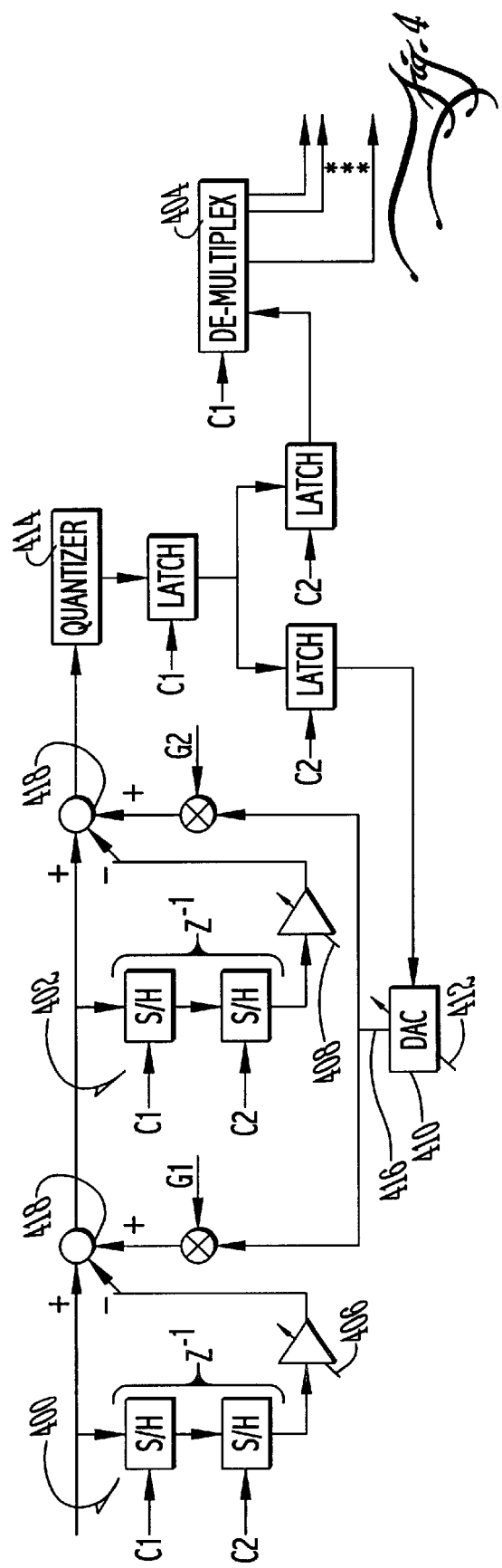

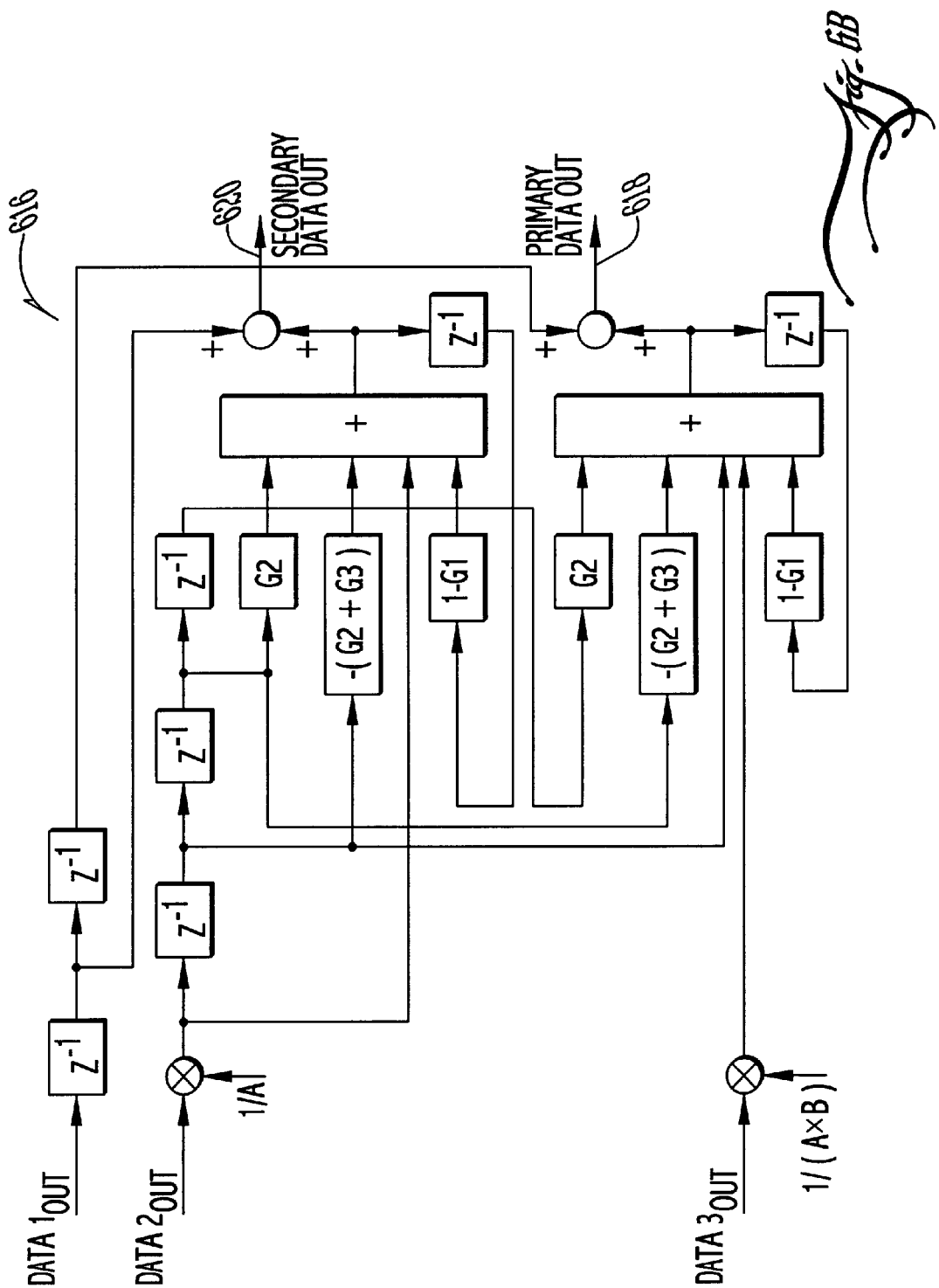

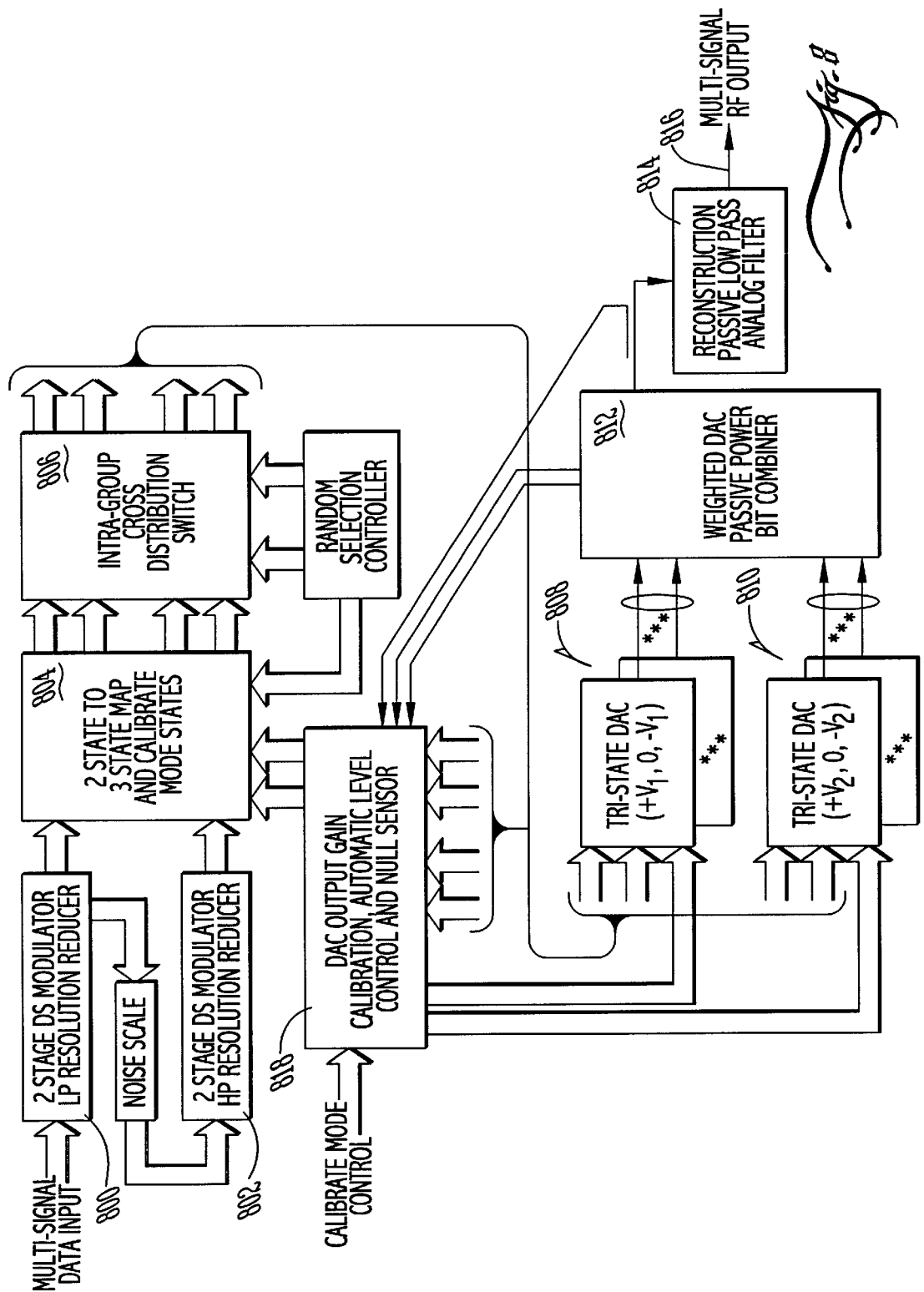

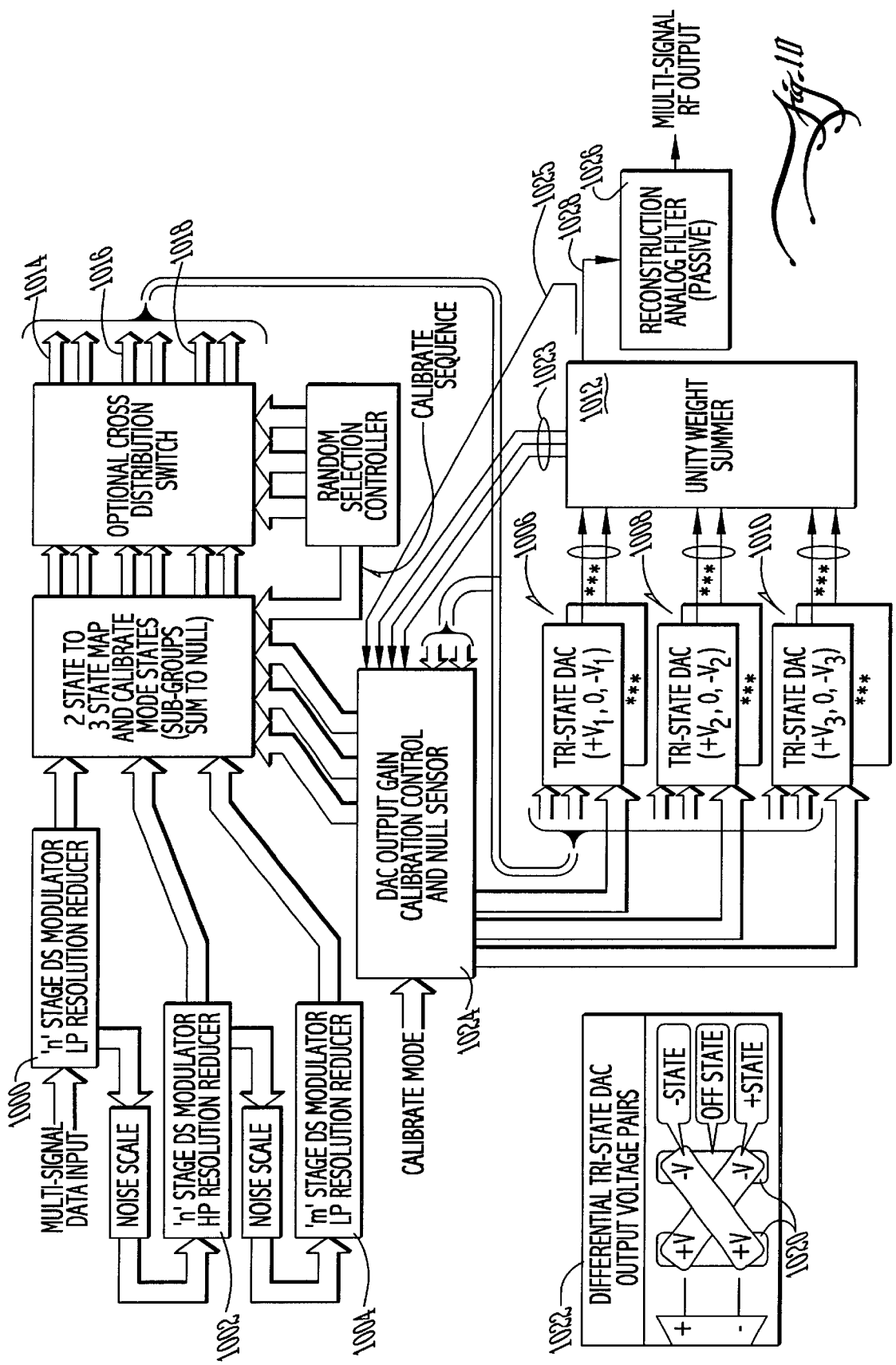

NYQUIST RESPONSE RESTORING DELTA-SIGMA MODULATOR BASED ANALOG TO DIGITAL AND DIGITAL TO ANALOG CONVERSION

FIELD OF THE INVENTION

The present invention generally relates to Nyquist response restoring delta-sigma modulator data converters, more particularly relates to Nyquist response restoring delta-sigma modulator based analog-to-digital and digital-to-analog converters, and even more particularly relates to Nyquist response restoring delta-sigma modulator converters for use in radio frequency communication equipment. Further, the invention generally relates to high pass delta-sigma modulator data converters and more particularly relates to high pass delta-sigma modulator based analog-to-digital and digital-to-analog converters.

BACKGROUND OF THE INVENTION

Digital (or "software") radios hold the promise of multiple-simultaneous-diverse signal transmission and reception over a wide bandwidth. The major components of such radios include direct sampling receivers (DSR) and direct digital transmitters (DDT). The wide bandwidth and the high dynamic range required for such radios have presented formidable obstacles to the development of this technology.

A DSR, for instance, can greatly reduce the conventional analog RF processing required of typical superheterodyne and homodyne receivers. This can lead to reduced cost, improved performance and multiple simultaneous signal recovery. The DSR's analog-to-digital converter (ADC) must support very high spurious-free dynamic ranges, including suppressed distortion products.

Current wide bandwidth ADCs have less than 100 dB of dynamic range and suppressed distortion. The peak envelope power of a multi-signal RF environment, however, can require as much as 150 dB of dynamic range. This must be achieved by a combination of pre-analog-to-digital conversion, undesired signal peak-envelope-power reduction and a large ADC dynamic range. High dynamic range ADCs can be produced using delta-sigma modulators as long as the oversampling ratio is large (for example, 10 times oversampling for multi-bit and 100 times oversampling for single bit). However, the conversion of very wide (hundreds of megahertz) bandwidths, coupled with the high dynamic range, makes typical delta-sigma modulators impractical for use in a DSR.

In addition to the benefits listed above, DDTs can provide the added advantage of generating signals having extremely low noise and distortion. They also can have a reduced life cycle cost. Traditional transmitter technology has been basically limited to a single excitation signal (carrier). This is because the receiver's sensitivity to low-level signals is likely compromised if the power amplifier is not extremely linear and low noise. This is especially true for co-site simultaneous transmit and receive applications. When the excitation contains multiple high level carriers, where there is probably a "picket fence" of transmitted distortion products, this concern takes on added significance.

Generally, the only way to obtain the required linearity from active amplifiers is to use Class A power amplifier operation. This, however, results in low operating efficiency. It consequently becomes readily apparent that one signal per power amplifier uses less power to suppress the distortion products to an acceptable level. Further, high Q filters are of limited utility since the distortion products can lie close to the desired carriers.

Consequently, there exists a need for analog-to-digital and digital-to-analog modulator architectures capable of providing a wide bandwidth, spurious free dynamic range with suppressed distortion products. More specifically, there exists a need for multi-bit Nyquist response restoring delta-sigma modulator ADC and Power DAC (digital-to-analog) converters for use in direct sampling receiver and direct digital transmitter components. Further, there exists a need for a high pass delta-sigma modulator component suitable for use in the ADC and DAC architectures. There exists a need for architectures having the wide bandwidth performance of a Nyquist converter, the spurious free, high dynamic range of a delta-sigma modulator and substantially reduced or eliminated decimation and reconstruction filter requirements.

SUMMARY OF THE INVENTION

It is an object of the present invention to provide a high pass delta-sigma modulator for analog-to-digital and digital-to-analog converters, as well as digital resolution reducers.

It is a feature of the present invention to utilize a cascade of differentiators, a quantizer and a digital-to-analog converter feedback structure for high pass analog-to-digital converters.

It is a feature of the present invention to utilize a cascade of differentiators, a digital-to-analog transducer, and an analog-to-digital converter feedback structure for high pass digital-to-analog converters.

It is a feature of the present invention to utilize a cascade of differentiators, a digital resolution reducer and a digital resolution expander feedback structure for high pass digital resolution reducers.

It is an advantage of the present invention to enable the shifting of noise down in frequency from the pass band.

It is another object of the present invention to provide a multi-bit, Nyquist response restoring delta-sigma modulator analog-to-digital converter.

It is another feature of the present invention to utilize a delta-sigma modulator at the input.

It is another advantage of the present invention to provide a high resolution analog-to-digital converter having usable output bandwidth up to the Nyquist frequency (half the sample frequency) and to provide such at all frequencies simultaneously, without tuning.

It is yet another object of the present invention to provide a multi-bit delta-sigma modulator based, Power DAC using Nyquist response restored bandwidth processing.

It is yet another feature of the present invention to utilize a delta-sigma modulator structure at the input.

It is yet another advantage of the present invention to provide a high resolution digital-to-analog converter having usable output bandwidth up to the Nyquist frequency (half the sample frequency) and to provide such at all frequencies simultaneously, without tuning.

The present invention involves delta-sigma modulator architectures that are well suited for use as wide bandwidth, very high dynamic range ADCs and DACs. The present Nyquist response restored delta-sigma modulator invention is carried out in a manner such that the overall effective over sampling ratio approaches unity and does not require the high over sampling ratio of current delta-sigma ADCs. The underlying architectures utilize discrete time (or sample) integration and differentiation. In doing so, the modulators can exhibit much higher performance in multi-stage modulators than the popular continuous time (analog) integration and differentiation. As opposed to the continuous time modulators, the discrete time architectures have minimal phase shift at high frequencies (½ sample clock). Using discrete time modulators allows for a high degree of control of the modulator transfer characteristics and their matching with the digital post processing. This permits the performance of specialized processing that would not be practical in typical delta-sigma modulators.

The Nyquist response restored delta-sigma modulator invention has several useful applications, including high performance RF conversion. For example, the present invention can be used as an ADC in a Direct Sampling Receiver, or as a linearized Power DAC in a Direct Digital Transmitter. When the present invention is used within a Direct Digital Transmitter or a Direct Sampling Receiver, it provides improved transmit signal generation or signal recovery performance, programmable flexibility and enables multiple-simultaneous-diverse-signal block transmission and recovery.

BRIEF DESCRIPTION OF THE DRAWINGS

The invention may be more fully understood by reading the following description of the preferred embodiments of the invention, in conjunction with the appended drawings wherein:

FIG. 1 is a block diagram of a direct sampling receiver.

FIG. 2 is a block diagram of a direct digital transmitter.

FIG. 3 is a graphical depiction of the RF analog-to-digital converter spectral environment for direct sampling reception.

FIG. 4 is a diagram of a two stage, high pass, delta-sigma modulator analog-to-digital converter architecture.

FIG. 6B is a diagram of the digital post processing performed on data received from the delta-sigma modulator analog-to-digital converter of FIG. 6A.

FIG. 8 is a block diagram of a multi-bit, delta-sigma modulator based, Power DAC having two digital resolution reducing modulator sets and using Nyquist response restored bandwidth processing.

FIG. 10 is a block diagram of another embodiment of a multi-bit, delta-sigma modulator based, Power DAC having three digital resolution reducing modulator sets and using Nyquist response restored bandwidth processing.

DETAILED DESCRIPTION

Figure 5:
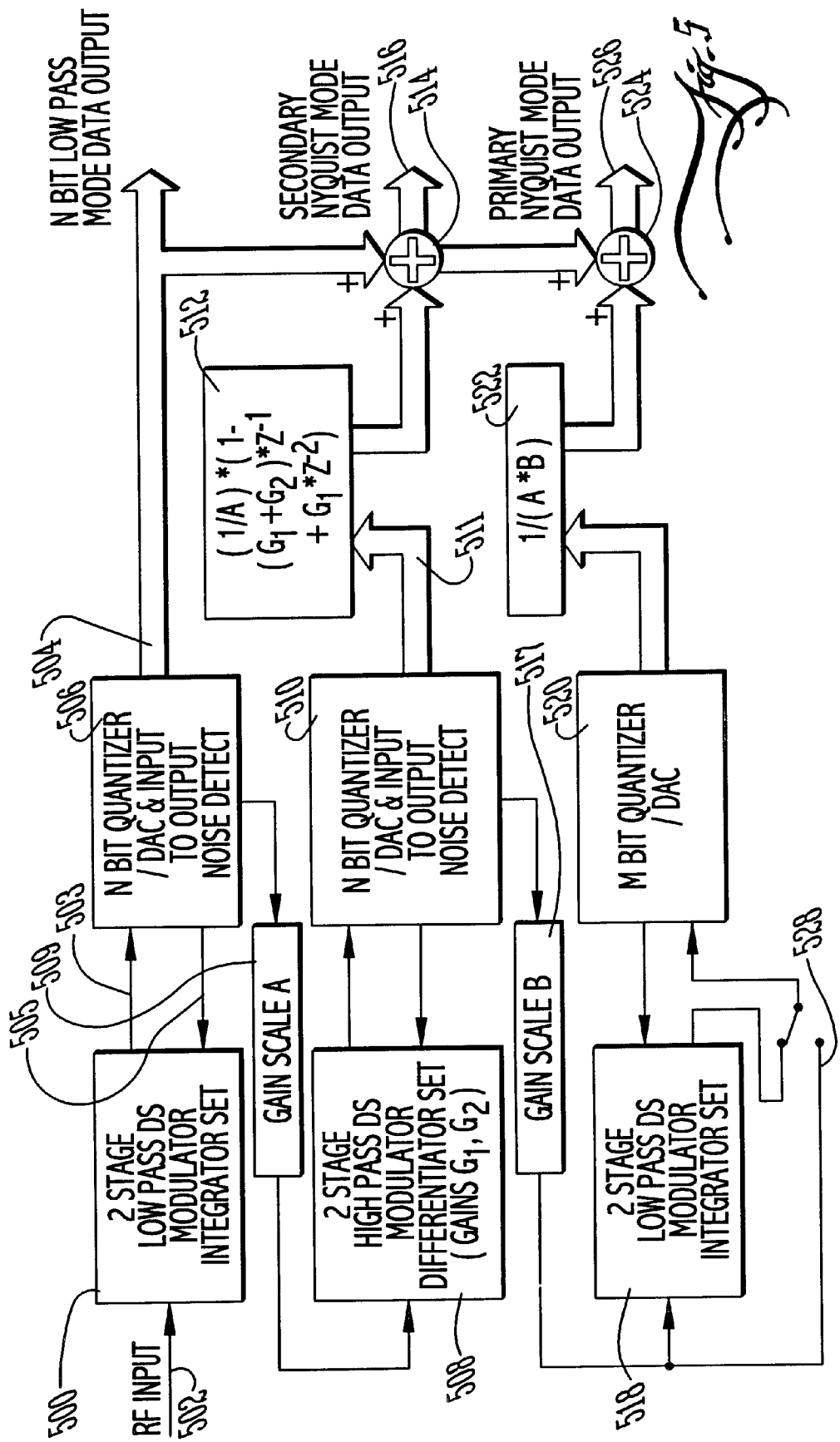
FIG. 5 is a block diagram of a Nyquist response restoring delta-sigma modulator based analog-to-digital converter.

FIG. 1 depicts the basic structure of a Direct Sampling Receiver (DSR). The DSR includes an antenna 100, a pre-select filter 102, a low noise amplifier 104, an ADC 106, a digital signal processor 108 and a data output 110. Similarly, FIG. 2 depicts the basic structure and components of a Direct Digital Transmitter (DDT). The DDT includes a data input 200, a digital signal processor 202, a digital-to-analog converter (DAC) 204, a RF filter/antenna coupler 206 and an antenna 208. In FIG. 2, the DAC 204 is shown to be a linearized Power DAC including a resolution reducer/noise shaper 210 and a saturated power amplifier 212. The DSR of FIG. 1 and the DDT of FIG. 2 cooperate to facilitate digital radio frequency communication.

FIG. 3 depicts a typical portion of a RF ADC spectral environment for direct sampling reception. Multiple-simultaneous-diverse signals 300 are depicted residing within a given wide bandwidth 302. The spurious free dynamic range 304 extends from the RF noise floor 306 to the peak envelope power ceiling 308 (which, in this example, includes +3 dB of ADC headroom). The spurious free dynamic range 304 includes the minimum signal of interest 310 as well as the other multiple-simultaneous signals 300. The thermal noise floor 312 is located below the RF noise floor 306 of the spurious free dynamic range 304. The specific values indicated in FIG. 3 are representative of one RF ADC spectral environment and are not intended to limit the scope of the invention in any way.

Patent application Ser. No. 08/994,729, filed Dec. 19, 1997, discloses various architectures for delta-sigma modulator based ADCs and DACs, many of which are discrete time. Patent application Ser. No. 08/994,729, filed Dec. 19, 1997, is hereby incorporated herein by reference in its entirety including all drawing figures and appendices. Patent application Ser. No. 09/384,002, filed Aug. 26, 1999, discloses delta-sigma modulator based ADC and DAC architectures having a low pass, band pass or tunable band pass characteristic. Patent application Ser. No. 09/384,002, filed Aug. 26, 1999, is hereby incorporated herein by reference in its entirety including all drawing figures and appendices. Patent application Ser. No. 09/383,305, filed Aug. 26, 1999, discloses architectures for implementing low distortion quantizer/DAC feedback for delta-sigma modulator based ADCs as well as digital-to-analog conversion for delta-sigma modulator based Power DACs. Patent application Ser. No. 09/383,305, filed Aug. 26, 1999, is hereby incorporated herein by reference in its entirety including all drawing figures and appendices.

Incorporated patent application Ser. No. 09/384,002 discloses a four stage delta-sigma modulator based ADC architecture, which has primarily a low pass noise shaping characteristic (i.e., one side of the signal pass band is at DC, and the noise is pushed to frequencies above the highest signal pass band frequency). An embodiment of a four-stage delta-sigma modulator based ADC architecture is included in FIG. 7A (see 700, FIG. 7A). Each stage of the architecture includes two sample-and-hold circuits to delay the stage output by one sample clock period and combine it with the stage input, thereby producing a sampled analog integrator.

The low pass converter uses discrete time, rather than continuous time integration, for optimum performance in higher order modulators. The modulator loop delay on noise is minimized, thereby allowing for stable operation using higher effective modulator loop gain than would be possible using continuous time integration (particularly in one bit output modulators). Using a dual latch delay after the quantizer matches the integrator stage's dual sample-and-hold delay, minimizes the feedback DAC transient responses and consequently minimizes the modulator output transient responses. The demultiplexer shown is an optional serialto-parallel conversion to reduce the physical data rate where needed (for example, to reduce the data bus rate between the modulator and decimator circuits). The "Gx" and "1-Gx" gain controls are used to stabilize the modulator, while at the same time maintaining a flat response to the modulator input at the modulator data output.

As the quantizer's resolution is increased above one bit, the Gx values can be increased. As a typical example, G1 and G2 can equal 0.15, and G3 can equal 0.3 at one bit resolution. As the resolution is increased to five bits, G1 and G2 can equal 0.8, and G3 can equal 1. This increase in modulator gain (reduction in modulator loss), while still maintaining stability, is primarily due to the fact that as the quantizer's resolution increases, the output's error from matching the input signal is reduced. As the error is reduced, it takes longer for the integrators to build up to an unstable condition. Therefore, if the effective modulator loop response is faster than the build up to instability time, the modulator remains stable.

As the number of quantizer bits increases, the total quantization noise decreases and the effective signal bandwidth increases. For example, a three bit quantizer can have a four fold bandwidth increases over the one bit performance. Further, there can be a nine fold increase when a four bit quantizer is used and a twelve fold increase for a five bit quantizer. However, this performance improvement can be lost, in part, if linearity is not maintained in the feedback DAC.

As noted, incorporated patent application Ser. No. 09/383,305 discloses a low distortion quantizer/DAC feedback structure for delta-sigma modulator based ADCs. Features of this architecture, which maintains low distortion while not adding appreciable additional noise to the quantizer output, include 1) a folded, monotonically progressive three state per bit quantizer, which maintains equal weighting of all output bits, 2) separate three state multi-DACs for each of the output bits, which are unity weight summed together for the analog output, 3) a random scrambling of the quantizer feedback bits to suppress distortion products due to imbalances in the multi-DAC outputs and the unity weight summer, 4) on line multi-DAC calibration to minimize imbalances in the multi-DAC outputs and the unity weight summer, and 5) three state to two state per bit mapping for output data binary processing compatibility. The multi-bit, linearized delta-sigma modulator based ADC provides superior performance over the single bit modulator, but it still must maintain an over-sampling-ratio (OSR) of approximately ten or more to maintain its high noise suppression performance (OSR=Fs/(2*BW), where Fs is the sample frequency and BW is the signal bandwidth). Further, the signal must be confined to the lower end of the spectrum, far below the Nyquist frequency (Fs/2).

Incorporated patent application Ser. No. 09/384,002 discloses architectures composed of efficient, frequency tunable resonator stages that can be grouped with low pass stages to provide further enhanced low pass bandwidth performance, a tunable center frequency, up to the Nyquist frequency, band pass performance, and multiple, independently tunable band passes in a common ADC output. The tunable band pass modulator can provide the desired frequency coverage when combined with low pass operation. Tuned band passes, however, must provide and maintain accurate center frequency placement. They must also provide for wide bandwidth signals as well as narrow bandwidth signals. Also, since the output noise is effectively shaped away from the tuned band passes, the digital decimation filter must be implemented as a tunable filter, not just a low pass filter.

The present invention establishes architectures that provide high performance Nyquist response restoring delta-sigma modulator based analog-to-digital and digital-to-analog conversion. Such converters use delta sigma modulators to produce high resolution ADCs and DACs with usable output bandwidth up to the Nyquist frequency at all frequencies simultaneously without tuning. These Nyquist response restoring ADC and DAC architectures include high pass delta-sigma modulators.

FIG. 4 depicts a two stage, synchronously sampled, high pass delta-sigma modulator based ADC architecture. The high pass modulator creates a signal pass band extending down in frequency from the Nyquist frequency (Fs/2) and shifts quantizer noise down in frequency away from the pass band. In the high pass modulator, the serial cascade of stages are differentiators (integrator stages are used in the low pass modulators). The architecture of FIG. 4 is called a "two stage" converter since it includes a first stage differentiator 400 and a second stage differentiator 402. Other embodiments of the delta-sigma high pass modulator can include one stage or more than two stages. FIG. 4 is intended to illustrate a basic structure that can be readily scaled to include various numbers of stages.

The depicted data output de-multiplexer 404 is an optional feature. When desired or required, it provides parallel data rate reduction. The first and second stage differentiators 400, 402 are subject to unity gain calibration 406, 408 and the DAC 410 is subject to a linearity calibration 412. The signal transducer is depicted as a quantizer 414, which can be a multi-bit quantizer. In addition, a two phase clock provides the C1 and C2 pulses indicated throughout FIG. 4.

In contrast to the low pass delta-sigma modulators, the DAC feedback signal 416 of the high pass modulator is summed 418 with, rather than subtracted from, each stage. The 'Gx' feedback gain adjustments, G1 and G2 in FIG. 4, are used to stabilize the modulator's operation (Gx<=1, as was the case for low pass modulators). Further, if Gx were reduced to zero, the ADC would pre-shape the analog input by the differentiator cascade transfer function, but not shape the quantizer noise. For stability with multi-bit quantizers, Gx should be less than unity and typically greater than 0.9 for this two stage high pass modulator.

The synchronously sampled, high pass delta-sigma modulator ADC architecture also can apply to DAC architectures, by making the following substitutions. The signal transducer, quantizer (414), becomes a digital-to-analog transducer that reduces the input resolution and converts the signal to analog. The inverse signal transducer (here feedback DAC 410) becomes an ADC, the sample-and-holds (S/H in 400 and 402) become latches, and the output and feedback latches become sample-and-holds. The optional demultiplexer (404) is obviously not used.

The synchronously sampled, high pass delta-sigma modulator ADC architectures depicted and described throughout this specification also can apply to digital signal resolution reducer architectures, by making the following substitutions. In FIG. 4, for example, the signal transducer, quantizer 414, becomes a data input resolution reducer (i.e., data rounder or data truncator). The inverse signal transducer, feedback DAC 410, becomes a data resolution expander and the sample-and-holds (S/H in 400 and 402) become latches.

The linearized transfer function for the two stage synchronously sampled, high pass delta-sigma modulator ADC architecture of FIG. 4 (as well as the described DAC and signal resolution reducer architectures) is:

$$Out_{Data}=IN_{RF}Z^{-1}(1-Z^{-1})^2+Noise_{Quan}Z^{-1}/(1-Z^{-1}(G1+G2)+G1\ Z^{-2}).$$

As stabilizing gains G1 and G2 go to 0 {$IN_{RF}$ Differentiator}:

$$Out_{Data}=IN_{RF}Z^{-1}(1-Z^{-1})^2+Noise_{Quan}Z^{-1}.$$

As stabilizing gains G1 and G2 go to 1 {High Pass Modulator}:

$$Out_{Data}=IN_{RF}Z^{-1}+Noise_{Quan}Z^{-1}/(1-Z^{-1})^2.$$

An embodiment of a Nyquist response restoring delta-sigma modulator-ADC is shown in FIG. 5. It contains a cascade of three, two-stage modulators in a unique arrangement. The first modulator 500 and signal transducer (quantizer)/DAC 506 set is a low pass modulator, accepting the RF input 502 and producing, for example, a six bit digitized output 504, while shifting the quantization noise to higher frequencies (above the signal pass band). This shifted noise is detected, using the difference between the quantizer input 503 and the inverse signal transducer (feedback DAC) output 505, and passed to the second modulator 508 and quantizer/DAC 510 set after undergoing any necessary gain scale adjustment 509. The second modulator 508 and quantizer/DAC 510 set is a high pass modulator, which shifts the quantization noise produced in its digitized output 511 down to lower frequencies. After quantization 510, the output 511 is subjected to a digital gain compensation operation 512. The two modulators' transfer responses are controlled and matched so as to flatten and reduce the noise across the entire Nyquist response bandwidth when the two outputs are digitally combined 514 as shown to create the Secondary Nyquist Mode Data Output 516. If desired, the low frequency resolution can be further improved by detecting the quantization noise from the second modulator 508 and quantizer/DAC 510 set and, after any necessary gain scale adjustment 517, passing it on to a third modulator 518 and quantizer/DAC 520 set (in this example, a low pass modulator). After undergoing quantization 520 and digital gain compensation 522, the outputs of the three digital converters are combined 524 to create the Primary Nyquist Mode Data Output 526.

The secondary data output 516 has increased numeric resolution relative to the first modulator output 504, due to the action of the secondary data output combiner 514, which is set to maintain a numeric resolution sufficient for the obtainable signal to quantization noise level. Similarly, the primary data output 526 has increased numeric resolution relative to the secondary data output 516, due to the action of the primary data output combiner 524, which is set to maintain a numeric resolution sufficient for the obtainable signal to quantization noise level. All three data outputs 504, 516, 526 are ADC outputs providing progressively higher resolution at wider signal bandwidths. Various applications employing the present inventions will require the inclusion of various combinations of one, two or three of these data outputs 504, 516, 526.

The Nyquist response restoring converter can be configured to cascade lower resolution multi-bit quantizers into a higher resolution quantizer without adding the distortion products normally associated with high resolution multi-bit architectures. For example, the resolution "N" of the first two quantizers 506, 510 depicted in FIG. 5 can be more or less than the resolution "M" of the third quantizer 520. Further, the first two quantizers need only have the same resolution to maintain a flat noise response in the secondary data output. In addition, it is possible to cascade stages of order 1, 2, 3, or more into the low pass and high pass modulators 500, 508, 518, but order 2 is considered optimum. Typically, single order modulators are prone to idle and spurious tone generation, and stable higher order modulators are less efficient.

The alternation of low pass 500, 518 and high pass 508 modulators shifts noise one direction and then back the other way thereby flattening the noise response of the low pass/high pass combination while achieving increased total noise reduction across the full Nyquist bandwidth. It is possible to cascade more than three modulators in this low pass, high pass, low pass, high pass, etc., arrangement, however, the incremental signal addition becomes so small that errors in the prior stage's noise error detection can overcome its accuracy. It is also possible to start the sequence with a high pass modulator instead of a low pass modulator, but the low pass modulator is slightly more efficient (Gx for low pass modulators is typically higher than for equivalent stage count high pass modulators for stable operation). The bypass switch 528 shown around the third (low pass) modulator 518 is an option for totally flat noise response from the primary output data shown. The optional third modulator 518 (if used) provides substantially more low frequency noise suppression with a small increase in noise at higher frequency.

The Nyquist response restoring delta-sigma modulator based ADC of the present invention is substantially different from the common multi-stage, subranging and digitally correcting, Nyquist response ADC. The common subranging and digitally correcting, Nyquist response ADC uses a cascade of lower resolution, flat noise response ADCs with intervening lower resolution DACs to sample and convert the signal in increasing stages of resolution accuracy. The staged ADC outputs normally overlap by one or two bits so that they can be combined digitally. The overlapping bits are used to check and correct for mismatch bit errors in the overlapping bits. These errors are due to quantization step size match errors and inaccuracy in removing the prior converter's reconstructed analog output from the subsequent converter's analog input.

The Nyquist response restoring delta-sigma modulator based ADC quantizes the signal only with the first converter's quantizer 506, not with the subsequent converter, and does it with a delta-sigma modulator 500 to suppress distortion product generation in the low resolution quantizer 506. Subsequent stages 508 and 510, 518 and 520 quantize ideally random noise signals, thereby helping to suppress additional distortion product generation. Further, the subsequent stages are, or can also be, delta-sigma modulators to further protect against distortion product generation from less than perfectly random noise signal inputs. It is not required, however, that the subsequent stages be delta-sigma modulators.

Figure 6A:
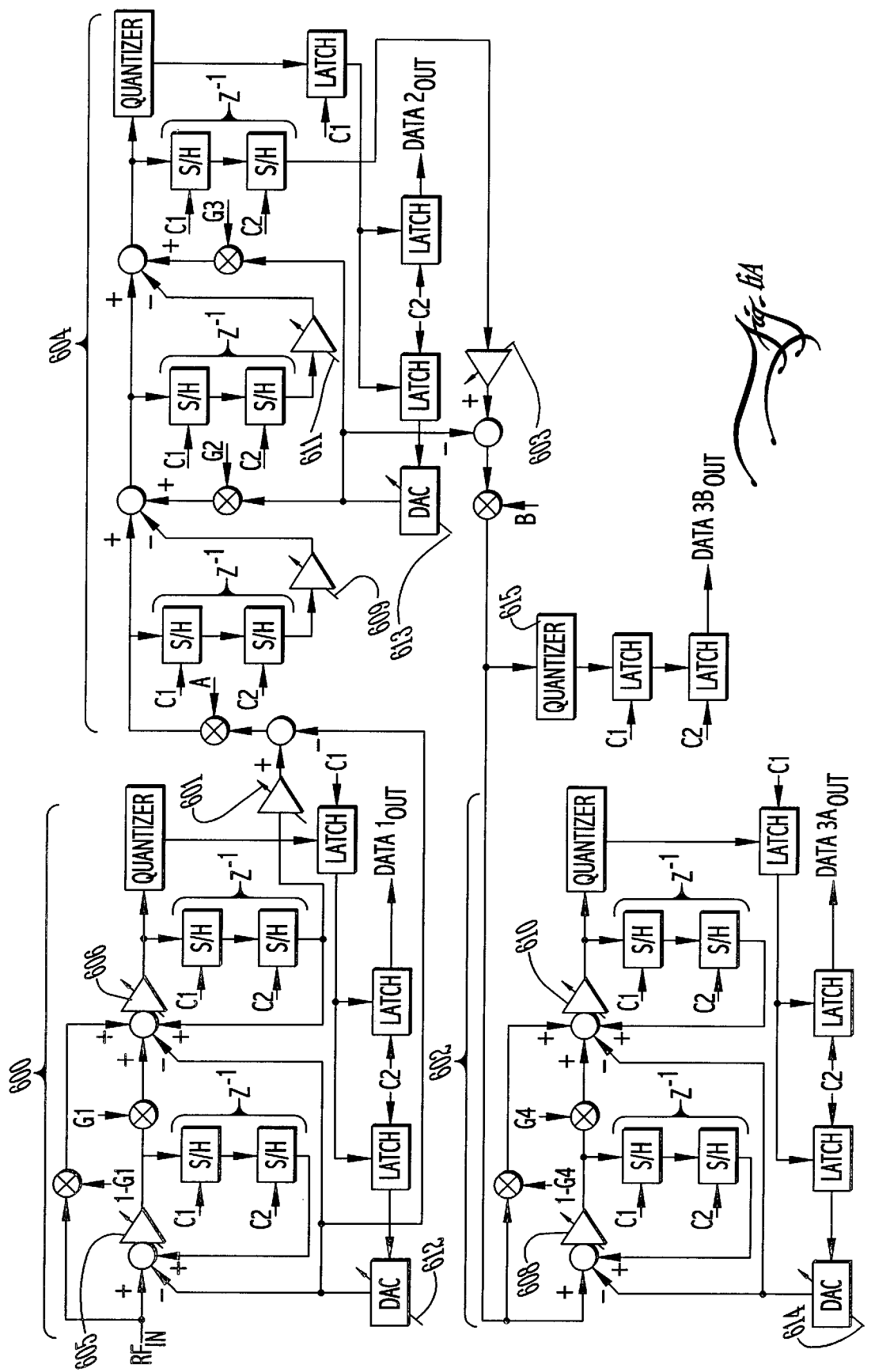
FIG. 6A is a diagram of a Nyquist response restoring delta-sigma modulator based analog-to-digital converter having two stages per delta-sigma modulator set.

FIG. 6A presents a more detailed view of an embodiment of the Nyquist response restoring delta-sigma modulator based ADC consistent with the block form depiction of FIG. 5. FIG. 6A includes a pair of two stage, synchronously sampled, low pass delta-sigma low pass ADC structures 600, 602, and a two stage, synchronously sampled, high pass delta-sigma modulator ADC structure 604. The integrator stages of each low pass modulator structure 600, 602 are subject to unity gain calibration 605, 606, 608, 610 and the DACs are subject to a linearity calibration 612, 614. The differentiator stages of the high pass modulator structure 604 is subject to cancellation accuracy calibration 609, 611, and the DAC is subject to a linearity calibration 613. The detected noise in the low pass modulator's 600 quantizer output is subject to accuracy calibration 601. The detected noise in the high pass modulator's 604 quantizer output is subject to accuracy calibration 603. Each two stage low pass modulator 600, 602 is a sub-set version of the four stage low pass modulator disclosed in incorporated patent application Ser. No. 09/384,002. A two phase clock provides the C1 and C2 pulses indicated throughout FIG. 6A. Generally, when multi-bit quantizers are used, stable operation can be maintained with the G1, G4 gain of the two stage low pass modulators 600, 602 set to unity.

FIG. 6A shows two different $DATA3_{OUT}$ signals; a $DATA3A_{OUT}$ signal from the third low pass modulator 602 and a $DATA3B_{OUT}$ signal from the bypass quantizer 615. Each of the output signals ($DATA1_{OUT}$, $DATA2_{OUT}$, and $DATA3A_{OUT}$ or $DATA3B_{OUT}$) undergo digital post processing 616 as shown in FIG. 6B. The $DATA3A_{OUT}$ or $DATA3B_{OUT}$ signal is input to the digital post processing 616 as the $DATA3_{OUT}$ signal. The digital post processing 616 performs the digital gain compensation 512, 522 and the combining 514, 524 functions depicted in the framework of FIG. 5. The Primary Data Out 618 and the Secondary Data Out 620 outputs are the equivalents, respectively, of the Primary Nyquist Mode Data Output 526 and the Secondary Nyquist Mode Data Output 516 of FIG. 5.

Accordingly, the embodiment of FIGS. 6A and 6B has three distinct modes of operation:

1) a "Two Stage Low Pass Delta-Sigma Signal Modulator 600+Two Stage Differential Noise Processor 604+ Noise Error Processor 615" mode wherein G1 is<=1, and G2 and G3 are=0;
2) a "Two Stage Low Pass Delta-Sigma Signal Modulator 600+Two Stage High Pass Delta-Sigma Noise Modulator 604+Noise Error Processor 615" mode wherein G1 is<=1, and G2 and G3 are<=1; and
3) a "Two Stage Low Pass Delta-Sigma Signal Modulator 600+2 Stage High Pass Delta-Sigma Noise Modulator 604+2 Stage Low Pass Delta-Sigma Noise Error Modulator 602" mode wherein G1 and G4 are<=1, and G2 and G3 are<=1.

The linearized transfer response equations for the three delta-sigma modulator sets and the Nyquist response restoring ADC of FIGS. 6A and 6B are:

$$DATA1_{OUT}=RF_{IN}Z^{-1}+NOISE1_{QUAN}Z^{-1}(1-Z^{-1})^2/(1-Z^{-1}(1-G1));$$

$$DATA2_{OUT}=-(NOISE1_{QUAN}Z^{-2}(1-Z^{-1})^2-NOISE2_{QUAN}Z^{-1})/(1-(G2+G3)Z^{-1}+(G2)Z^{-2});$$

$$DATA3A_{OUT}=-NOISE2_{QUAN}Z^{-2}+NOISE3A_{QUAN}Z^{-1}(1-Z^{-1})^2/(1-Z^{-1}(1-G4));$$

$$DATA3B_{OUT}=-NOISE2_{QUAN}Z^{-2}+NOISE3B_{QUAN}Z^{-1};$$

Secondary Data Out$=RF_{IN}Z^{-2}+NOISE2_{QUAN}Z^{-1}/(1-Z^{-1}(1-G1));$

Primary Data Out $A=RF_{IN}Z^{-3}+NOISE3A_{QUAN}Z^{-1}(1-Z^{-1})^2/[(1-Z^{-1}(1-G1))(1-Z^{-1}(1-G4))];$ and $$\text{Primary Data Out}\_B=RF_{IN}Z^{-3}+NOISE3B_{QUAN}Z^{-1}/(1-Z^{-1}(1-G1)).$$

The linearized transfer response equations for a multi-bit embodiment wherein G1=G4=1, are:

$$DATA1_{OUT}=RF_{IN}Z^{-1}+NOISE1_{QUAN}Z^{-1}(1-Z^{-1})^2;$$

$$DATA2_{OUT}=-(NOISE1_{QUAN}Z^{-2}(1-Z^{-1})^2-NOISE2_{QUAN}Z^{-1})/(1-(G2+G3)Z^{-1}+(G2)Z^{-2});$$

$$DATA3A_{OUT}=-NOISE2_{QUAN}Z^{-2}+NOISE3A_{QUAN}Z^{-1}(1-Z^{-1})^2;$$

$$DATA3B_{OUT}=-NOISE2_{QUAN}Z^{-2}+NOISE3B_{QUAN}Z^{-1};$$

Secondary Data Out$=RF_{IN}Z^{-2}+NOISE2_{QUAN}Z^{-1};$

Primary Data Out$\_A=RF_{IN}Z^{-3}+NOISE3A_{QUAN}Z^{-1}(1-Z^{-1})^2;$ and

Primary Data Out$\_B=RF_{IN}Z^{-3}+NOISE3B_{QUAN}Z^{-1}.$

The linearized transfer response equations for the multi-bit embodiment wherein G1=G4=1, and wherein G2 and G3 approach 1, are:

$$DATA1_{OUT}=RF_{IN}Z^{-1}+NOISE1_{QUAN}Z^{-1}(1-Z^{-1})^2;$$

$$DATA2_{OUT}=-NOISE1_{QUAN}Z^{-2}+NOISE2_{QUAN}Z^{-1}/(1-Z^{-1});$$

$$DATA3A_{OUT}=-NOISE2_{QUAN}Z^{-2}+NOISE3A_{QUAN}Z^{-1}(1-Z^{-1})^2;$$

$$DATA3B_{OUT}=-NOISE2_{QUAN}Z^{-2}+NOISE3B_{QUAN}Z^{-1};$$

Secondary Data Out$=RF_{IN}Z^{-2}+NOISE2_{QUAN}Z^{-1};$

Primary Data Out$\_A=RF_{IN}Z^{-3}+NOISE3A_{QUAN}Z^{-1}(1-Z^{-1})^2;$ and

Primary Data Out$\_B=RF_{IN}Z^{-3}+NOISE3B_{QUAN}Z^{-1}.$

The linearized transfer response equations for the multi-bit embodiment wherein G1=G4=1, and wherein G2=G3=0, are:

$$DATA1_{OUT}=RF_{IN}Z^{-1}+NOISE1_{QUAN}Z^{-1}(1-Z^{-1})^2;$$

$$DATA2_{OUT}=-NOISE1_{QUAN}Z^{-2}(1-Z^{-1})^2+NOISE2_{QUAN}Z^{-1};$$

$$DATA3A_{OUT}=-NOISE2_{QUAN}Z^{-2}+NOISE3A_{QUAN}Z^{-1}(1-Z^{-1})^2;$$

$$DATA3B_{OUT}=-NOISE2_{QUAN}Z^{-2}+NOISE3B_{QUAN}Z^{-1};$$

Secondary Data Out$=RF_{IN}Z^{-2}+NOISE2_{QUAN}Z^{-1};$

Primary Data Out$\_A=RF_{IN}Z^{-3}+NOISE3A_{QUAN}Z^{-1}(1-Z^{-1})^2;$ and

Primary Data Out$\_B=RF_{IN}Z^{-3}+NOISE3B_{QUAN}Z^{-1}.$

Examining the preceding linearized equations, one may be led to think that the values of G2 and G3 have no effect on the secondary and primary data outputs. This would be true if no distortion products or noise detection losses were involved (i.e., strictly ideal performance). However, distortion products are created by non-linearities, which includes low resolution quantizers. Setting G2 and G3 to zero produces no delta-sigma modulation suppression effect on the noise and distortion produced by the high pass modulator's quantizer output. In other words, the high pass modulator is not suppressing quantizer distortion product generation. As long as the high pass modulator's input is random noise (no distinct tones), then significant distortion products are not produced. However, inaccuracy in detecting the noise from the first modulator set 600 will leave some small input signal tone content in the noise input to the second modulator set 604. These tones can produce low level distortion products in the second modulator set 604 output when G2=G3=0. These distortion products can show up in the secondary data output directly, and can show up in the primary data output if the distortion is not accurately detected and passed to the third modulator set 602. From this discussion, one can observe a major benefit to using a delta-sigma modulator with a low resolution quantizer; namely output distortion products are suppressed and turned into shaped random noise.

Figure 7A:
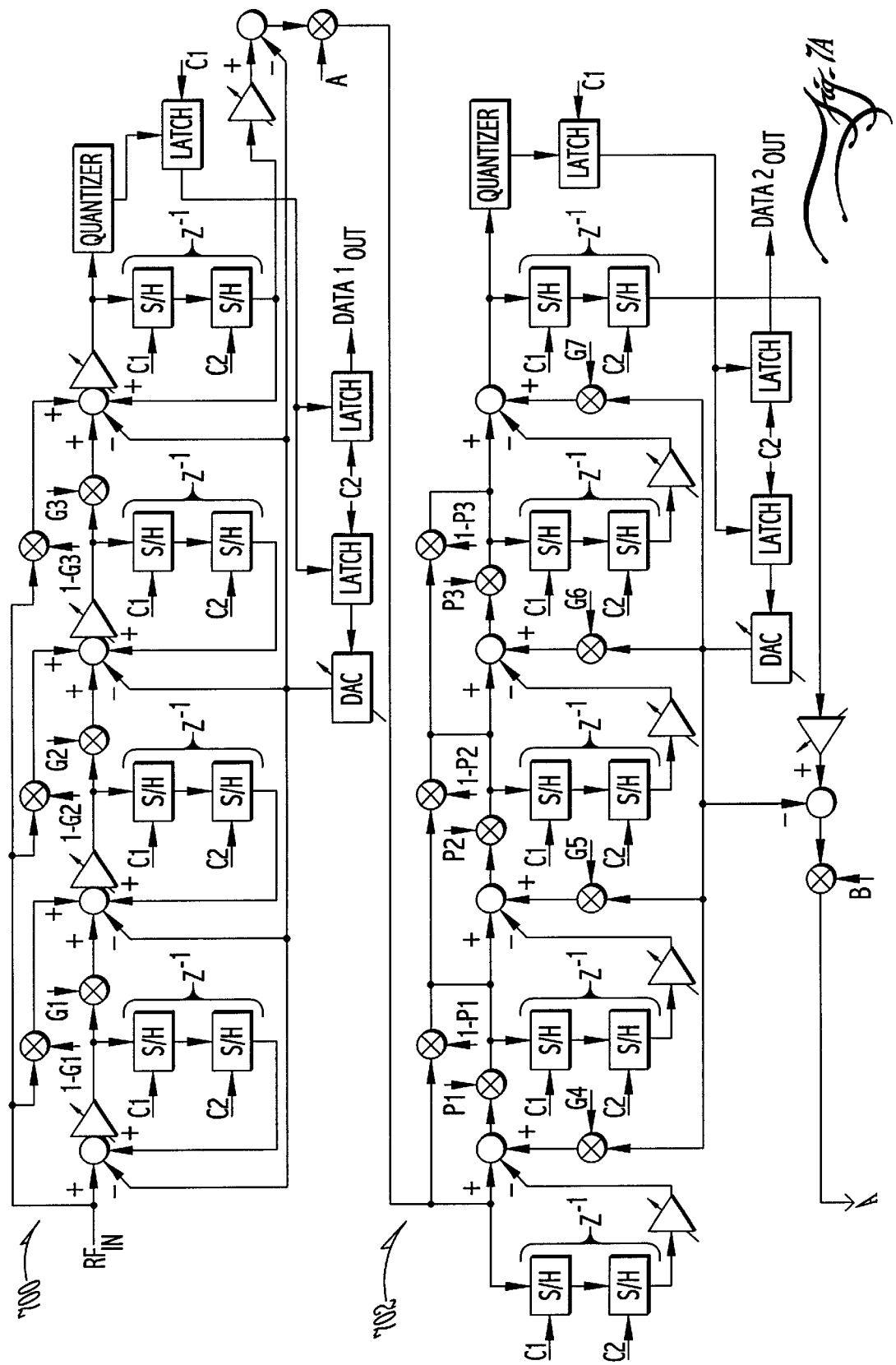
FIGS. 7A and 7B depict a Nyquist response restoring delta-sigma modulator based analog-to-digital converter having four stages per delta-sigma modulator set.
Figure 7B:
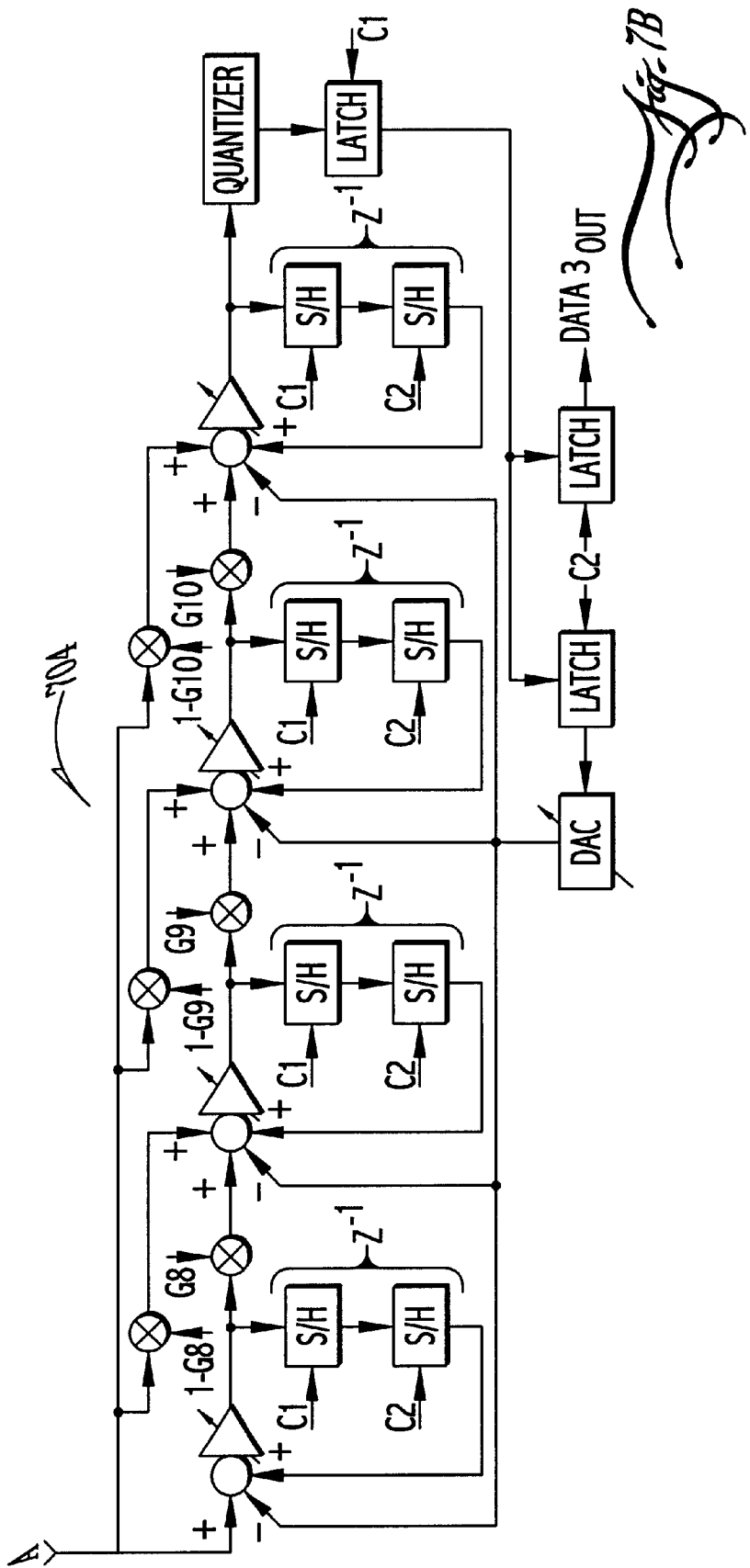
Figure 7C:
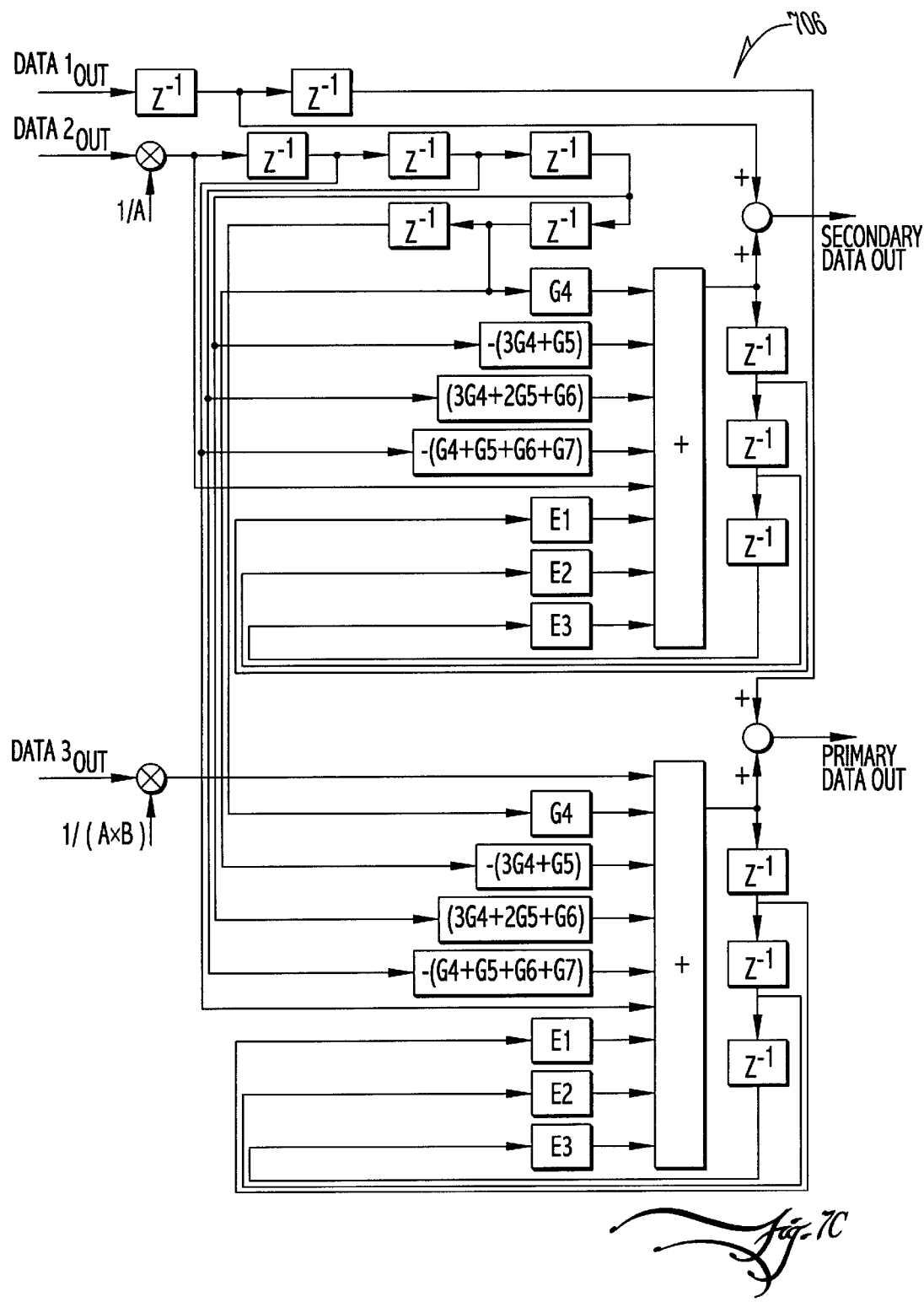
FIG. 7C is a diagram of the digital post processing performed on data received from the delta-sigma modulator analog-to-digital converter of FIGS. 7A and 7B.

FIGS. 7A, 7B and 7C depict another embodiment of the Nyquist response restoring delta-sigma modulator based ADC of the present invention. This embodiment has a series of four stage delta-sigma modulator sets. A four stage low pass delta-sigma modulator ADC set 700, FIG. 7A, is followed by a four stage high pass delta-sigma modulator ADC set 702, FIG. 7A, which is in turn followed by a second four stage low pass delta-sigma modulator ADC set 704, FIG. 7B. In FIG. 7A, P1, P2 and P3 are switches having a value only equal to 1 or 0, and are used to reduce the number of active stages in modulator set 702. For example, setting P1=0 sets up a three stage modulator set. Setting both P1 and P2=0 sets up a two stage modulator set. Likewise, setting P1, P2 and P3=0 sets up a one stage modulator set. Similarly, modulator set 700 and modulator set 704 can be reduced in the number of active stages by setting G1, G2 and G3, and G8, G9 and G10 respectively to zero as required by the number of active stages desired. Integration stage unity loop gain, subtraction stage cancellation and DAC linearity calibrations are, as in FIG. 6A, also included.

As in FIG. 6B, the appropriate digital post processing 706, FIG. 7C, structure for the embodiment of FIGS. 7A, 7B and 7C is also illustrated. The relationship between the E1, E2 and E3 values and the G1, G2 and G3 values of FIG. 7C are as follows:

For $G1$, $G2$ and $G3>0$; $E1=3-G3(1+G2(1+G1))$, $E2=G3(2+G2)-3$, and $E3=1-G3$.

For $G1=0$, and $G2$ and $G3>0$; $E1=2-G3(1+G2)$, $E2=G3-1$, and $E3=0$.

For $G1=G2=0$ and $G3>0$; $E1=1-G3$, and $E2=E3=0$.

For $G1$, $G2$ and $G3=0$; $E1=E2=E3=0$.

The linearized transfer response equations for the three delta-sigma modulator sets and the Nyquist response restoring ADC of FIGS. 7A, 7B, 7C, wherein GX ranges from 0 to 1 for X=1,2,3, . . . , 10, are:

$DATA1_{OUT}=RF_{IN}Z^{-1}+NOISE1_{QUAN}Z^{-1}(1-Z^{-1})^4/((1-Z^{-1})^3+G3Z^{-1}((1-Z^{-1})^2+G2(1-Z^{-1})+G1G2))$;

$DATA2_{OUT}=-(A*NOISE1_{QUAN}Z^{-2}(1-P1Z^{-1})(1-P2Z^{-1})(1-P3Z^{-1})(1-Z^{-1})-NOISE2_{QUAN}Z^{-1})/(1+P1G4Z^{-4}-(3P1G4+P2G5)Z^{-3}+(3P1G4+2P2G5+P3G6)Z^{-2}-(P1G4+P2G5+P3G6+G7)Z^{-1})$;

$DATA2_{OUT}=-(A*NOISE1_{QUAN}Z^{-2}(1-Z^{-1})^4-NOISE2_{QUAN}Z^{-1})/(1-G4Z^{-1}(1-Z^{-1})^3-G5Z^{-1}(1-Z^{-1})^2-G6Z^{-1}(1-Z^{-1})-G7Z^{-1})$, when $P1=P2=P3=1$;

$DATA3_{OUT}=-B*NOISE2_{QUAN}Z^{-2}+NOISE3_{QUAN}Z^{-1}(1-Z^{-1})^4/((1-Z^{-1})^3+G10Z^{-1}((1-Z^{-1})^2+G9(1-Z^{-1})+G8G9))$;

Secondary Data Out=$RF_{IN}Z^{-2}+NOISE2_{QUAN}Z^{-1}/(A((1-Z^{-1})^3+G3Z^{-1}((1-Z^{-1})^2+G2(1-Z^{-1})+G1G2)))$;

and

Primary Data Out=$RF_{IN}Z^{-3}+NOISE3_{QUAN}Z^{-1}(1-Z^{-1})^4/(A*B((1-Z^{-1})^3+G3Z^{-1}((1-Z^{-1})^2+G2(1-Z^{-1})+G1G2))((1-Z^{-1})^3+G10Z^{-1}((1-Z^{-1})^2+G9(1-Z^{-1})+G8G9)))$.

It will be appreciated that, by following the teachings of the present invention, a variety of other Nyquist response restoring delta-sigma modulator ADCs can be constructed. For example, a structure having a three stage low pass delta-sigma modulator ADC set, followed by a three stage high pass delta-sigma modulator ADC set, which is in turn followed by a second three stage low pass delta-sigma modulator ADC set can be created. Such a structure would be similar to that depicted in FIGS. 6A and 6B or FIGS. 7A, 7B and 7C. The linearized transfer response equations for this 3×3×3 stage multi-bit embodiment are presented below.

For $P1$, $G1$, $G4$ and $G8=0$; $P2$ and $P3=1$ ("$A$" and "$B$" being noise gains):

$DATA1_{OUT}=RF_{IN}Z^{-1}+NOISE1_{QUAN}Z^{-1}(1-Z^{-1})^3/((1-Z^{-1})^2+G3Z^{-1}((1-Z^{-1})+G2))$;

$DATA2_{OUT}=-(A*NOISE1_{QUAN}Z^{-2}(1-Z^{-1})^3-NOISE2_{QUAN}Z^{-1})/(1-G5Z^{-1}(1-Z^{-1})^2-G6Z^{-1}(1-Z^{-1})-G7Z^{-1})$;

$DATA3_{OUT}=-B*NOISE2_{QUAN}Z^{-2}+NOISE3_{QUAN}Z^{-1}(1-Z^{-1})^3/((1-Z^{-1})^2+G10Z^{-1}((1-Z^{-1})+G9))$;

Secondary Data Out=$RF_{IN}Z^{-2}+NOISE2_{QUAN}Z^{-1}/(A((1-Z^{-1})^2+G3Z^{-1}((1-Z^{-1})+G2)))$;

and

Primary Data Out=$RF_{IN}Z^{-3}+NOISE3_{QUAN}Z^{-1}(1-Z^{-1})^3/(A*B((1-Z^{-1})^2+G3Z^{-1}((1-Z^{-1})+G2))((1-Z^{-1})^2+G10Z^{-1}((1-Z^{-1})+G9)))$.

By way of further example, a structure having a one stage low pass delta-sigma modulator ADC set, followed by a one stage high pass delta-sigma modulator ADC set, which is in turn followed by a second one stage low pass delta-sigma modulator ADC set can be created. The linearized transfer response equations for this 1×1×1 stage multi-bit embodiment appear below.

For $P1$, $P2$, $P3$, $G1$, $G2$, $G3$, $G4$, $G5$, $G6$, $G8$, $G9$, $G10=0$:

$DATA1_{OUT}=RF_{IN}Z^{-1}+NOISE1_{QUAN}Z^{-1}(1-Z^{-1})$;

$DATA2_{OUT}=-(A*NOISE1_{QUAN}Z^{-2}(1-Z^{-1})-NOISE2_{QUAN}Z^{-1})/(1-G7Z^{-1})$;

$DATA3_{OUT}=-B*NOISE2_{QUAN}Z^{-2}+NOISE3_{QUAN}Z^{-1}(1-Z^{-1})$;

Secondary Data Out=$RF_{IN}Z^{-2}+NOISE2_{QUAN}Z^{-1}/A$;

and

Primary Data Out=$RF_{IN}Z^{-3}+NOISE3_{QUAN}Z^{-1}(1-Z^{-1})/(A*B)$.

Nyquist response restoring delta-sigma modulator ADCs having other numbers of stages per modulator set can also be constructed.

In additional embodiments, the number of stages in each set need not be equivalent. For example, alternative configurations can have an "m" stage low pass delta-sigma modulator ADC set, followed by an "m" stage high pass delta-sigma modulator ADC set, which is in turn followed by an "n" stage low pass delta-sigma modulator ADC set (m×m×n stage) wherein m>n. One such embodiment, for example, includes a two stage low pass delta-sigma modulator ADC set (signal modulator), followed by a two stage high pass delta-sigma modulator ADC set (noise modulator), which is in turn followed by a four stage low pass delta-sigma modulator ADC set (noise error modulator). The linearized transfer response equations for this 2×2×4 stage embodiment follow.

For $G1$, $G2$, $G4$, $G5$, $P1$ and $P2=0$; $G3$, $G6$, $G7$, $G8$, $G9$ and $G10<=1$; and $P3=1$:

$DATA1_{OUT}=RF_{IN}Z^{-1}+NOISE1_{QUAN}Z^{-1}(1-Z^{-1})^2/((G3-1)Z^{-1}+1)$;

$DATA2_{OUT}=-(A*NOISE1_{QUAN}Z^{-2}(1-Z^{-1})^2-NOISE2_{QUAN}Z^{-1})/(1-G6Z^{-1}(1-Z^{-1})-G7Z^{-1})$;

$DATA3_{OUT}=-B*NOISE2_{QUAN}Z^{-2}+NOISE3_{QUAN}Z^{-1}(1-Z^{-1})^4/((1-$ $Z^{-1})^3+G10Z^{-1}((1-Z^{-1})^2+G9(1-Z^{-1})+G8G9));$

Secondary Data Out=$RF_{IN}Z^{-2}$+NOISE2$_{QUAN}Z^{-1}/(A((G3-1)Z^{-1}+1));$ and Primary Data Out=$RF_{IN}Z^{-3}$+NOISE3$_{QUAN}Z^{-1}(1-Z^{-1})^4/(A*B((G3-1)Z^{-1}+1)((1-Z^{-1})^3+G10Z^{-1}((1-Z^{-1})^2+G9(1-Z^-)+G8G9))).$ Other related embodiments are also contemplated and are considered to be within the scope of the present invention. For example, the Nyquist response restoring delta-sigma modulator ADC can include other numbers of stages in the m×m×n stage structures. Also, structures with fully independent numbers of modulator stages, such as m×n×r stage structures, can be formed to achieve specialized noise shaping across the Nyquist band. Further, structures having two modulator sets and structures having more than three modulator sets are contemplated. In addition, although preferred for best distortion suppression, it is not necessary that all of the modulator sets be delta-sigma based. For example, one or more modulator sets of a multi-set structure can be non-delta sigma based modulators.

The present invention requires little or no filtering before decimation of the ADC output. This is very important when the ADC output sample rate is high, normally requiring large, parallel processed, filter arrays to reduce high level noise content prior to sample rate decimation. It becomes even more of a consideration when the signal of interest needs to be digitally translated to base band prior to decimation filtering (implements a band pass filter), since the decimation filtering is now complex ('I' and 'Q') and twice as large.

The ability to achieve high performance with little or no filtering of the digital output can even more significantly benefit the linearized DAC, especially the RF Power DAC. Incorporated patent application Ser. No. 09/383,305 discloses architectures for implementing low distortion, linearized delta-sigma modulator based DACs. One such architecture applies to low pass (or band pass) delta-sigma modulator based multi-bit DACs. The linearized DAC is related to the linearized multi-bit ADC that is disclosed in incorporated patent application Ser. No. 09/383,305 (see FIG. 1 thereof). The Power DAC includes a delta-sigma modulator structure to reduce the bits of resolution without sacrificing in-band noise and distortion performance (distortion is suppressed and noise is shaped away from the signal pass band). The reconstruction analog filter removes the out-of-band noise and distortion such that, for RF Power DAC applications, the out-of-band noise and distortion is not radiated from the transmitter. This means that, generally, the reconstruction filter should be passive, so as not to create additional distortion products, and tunable, so as to place the variable bandwidth pass band on the desired center frequency.

A block diagram of an embodiment of a 2×2 Nyquist restored response delta-sigma modulator based Power DAC is depicted in FIG. 8. The high resolution multi-carrier composite digital excitation signal is supplied to a two stage, low pass delta-sigma modulator 800, acting as a controlled noise response resolution reducer, that pushes the noise added by the digital resolution reducer (truncator or rounder) up to higher frequencies. The added noise is detected and passed as the input to the second modulator, a two stage, high pass delta-sigma modulator 802 that also acts as a controlled noise response resolution reducer. The added noise produced by the second modulator's digital resolution reducer (truncator or rounder) is pushed down in frequency, and when the two modulator data outputs are combined, a set of spectra such as those depicted in FIG. 9 can result.

Figure 9:
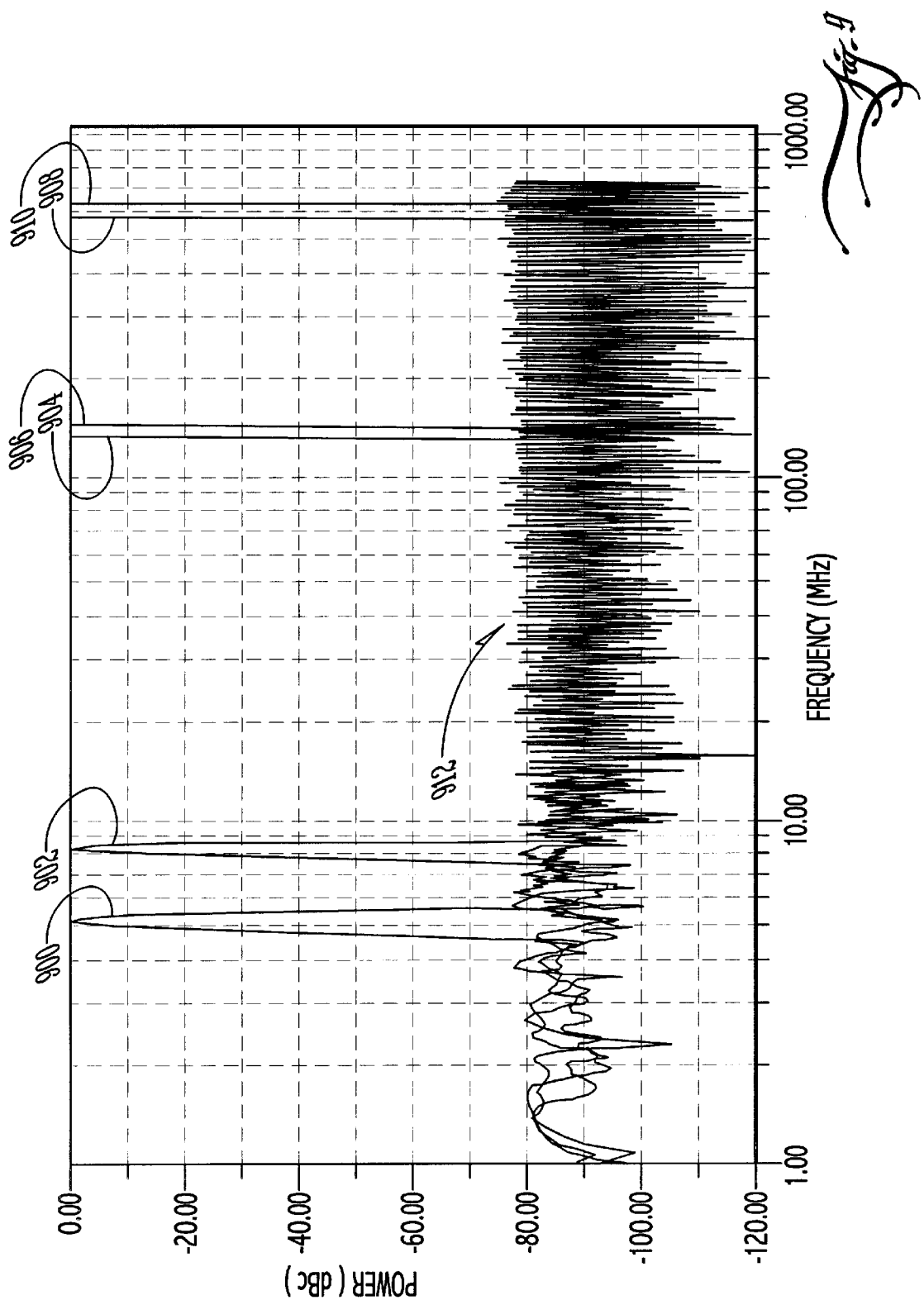
FIG. 9 is a representative composite spectral plot of three sets of two-tone, multi-signal outputs for the Power DAC of FIG. 8, using 6 bit quantizers and a 1500 MS/sec sample rate.

FIG. 9 depicts the simulated spectral performance of a 2×2 Nyquist restored response delta-sigma modulator based Power DAC such as that depicted in FIG. 8. The plot shows three two-tone traces 900, 902, and 904, 906, and 908, 910 distributed across the Nyquist pass band, Fs/2, where the sample frequency (Fs) is 1500 MHz. The behavioral simulation of FIG. 9 involved use of six bit modulator outputs, and 16K Point Windowed FFTs, 278 KHz resolution (54.4 dBHz). In this simulation, the following parameters were used: A=28, G1=G2=0.925 (modulator 802), and both modulator stage delays were 67 pS, each stage. The noise response 912 is flat, with a negative 137 dBc/Hz noise density, 12.5 bits effective at 1 MHz bandwidth, and no distortion products are apparent.

Referring again to FIG. 8, in order to establish a linearized Power DAC response, the outputs are not directly combined. Any incremental step size difference in the way the DAC responds to an increase in the data output state can result in distortion products when acting upon transmitted carriers. This architecture circumvents this problem by mapping 804 the separate data outputs to separate tri-state sets of bits, which exhibit monotonic value change progression. The monotonic sets of bits are uniformly weighted such that they may be in any order (within the set), therefore producing the same result when combined.

Referring back to FIG. 5, the signal transmitted from the output 511 of the high pass modulator must be gain adjusted 512 before being combined (summed) with the low pass modulator output 504. The same is true with the modulators in FIG. 8. The "1/A" scale factor can be differed and incorporated into the DAC power drivers and combiner, but the "1−(G1+G2)$Z^{-1}$+G1 $Z^{-2}$" factor, $(1-Z^{-1})^2$ as G1 and G2 approach 1, must be accomplished before the digital output is passed to the mapper 804.

The mapped bit groupings are pseudo-randomly shuffled 806 from sample to sample resulting in a dithered suppression of distortion products that would otherwise be produced in the DAC drivers 808, 810 and combiner 812.

The shuffled data bit groups are passed on to the two sets of tri-state DAC power drivers 808, 810. There is one tri-state DAC power driver for each bit. For example, in a six bit embodiment, each of the groups 808, 810 of tri-state drivers includes six tri-state DAC power drivers, assuming that the high pass modulator 802 output resolution remains the same after scaling by the "1−(G1+G2)$Z^{-1}$+G1 $Z^{-2}$", factor. The power driver outputs are passively combined 812 to form the RF composite output signal. The "1/A" scale factor can be incorporated into the DAC drivers group 810 and/or the weighting in the power combiner 812. The combined RF output is passed through a passive low pass filter 814 to remove the high frequency artifacts from the sampled data.

Since the individual bit drivers share the transmit output power, each driver's output power is relatively small compared to the composite envelope power. Further, each power driver is primarily in one of three states, two saturated states and a "float" or "off" condition. Consequently, the efficiency can be very high. Still further, since the analog RF output 816 is formed strictly by linear passive means, distortion products from composite carrier signals are suppressed.

The shuffling 806 of the bits effectively transforms residual distortion energy into noise, which is also not desirable. As a means to mitigate the noise, each power bit driver of each group 808, 810 has independent variable bias supplies, which can be controlled via the feedback calibration component 818 to balance out variations between the bit driver outputs. This feedback calibration also compensates for imbalances in the individual combiner 812 inputs to keep the residual distortion low. In this way, the output noise can also be kept low.

FIG. 10 depicts another embodiment of a high performance multi-bit delta-sigma Power DAC with Nyquist response restored processing. The block diagram of FIG. 10 depicts a three set (n×n×m stage) 1000, 1002, 1004 Nyquist restored response delta-sigma modulator based Power DAC. Consequently, this embodiment includes three subgroups of multi-DACs 1006, 1008, 1010 (as opposed to two subgroups 808, 810 for the two set embodiment of FIG. 8). Operationally, however, the embodiments of FIGS. 8 and 10 are otherwise substantially the same. In the embodiments of FIGS. 8 and 10, all digital post processing on each of the modulator outputs, other than the noise scale compensation factors, can be performed within each respective modulator block. The noise scale compensation factors, "1/A" and "1/(A*B)", can be incorporated into the +/−$V_2$ and +/−$V_3$ bias rails in DAC driver groups 1008 and 1010 respectively and/or the input group weighting of the combiner 1012.

The summation of the three digital modulator outputs can be accomplished, as shown, via the subgroups of linearized multi-DACs 1006, 1008, 1010. It will be appreciated that the following discussion is also applicable to other embodiments, such as FIG. 8, having different numbers of delta-sigma modulation resolution reducers and therefore a corresponding different number of multi-DAC subgroups. The actual sum is part of the output unity weight summer 1012, which becomes part of the multi-DACs' calibration-on-demand protocol. Since the three modulator outputs have different amplitude scalings (unity, 1/A, and 1/(A*B) as shown in FIG. 6B for example), the multi-DACs would have to accommodate a large resolution span (weighting adjusted overlap of the three outputs). Such an arrangement could require thousands of individual tri-state multi-DACs. Obviously, such a structure is not desirable.

The present invention initially keeps the three outputs separate by directing each output 1014, 1016, 1018 to a separate sub-group of multi-DACs 1006, 1008, 1010, each sub-group having a different +/−V output state rail 1020 and/or different overall weighting between unity weight sub-groups, which are related by the respective amplitude scalings of the three outputs. The differential three state DAC output voltage pairs for each DAC of the various sub-groups 1006, 1008, 1010 are depicted in the insert 1022 to FIG. 10, The calibration-on-demand operation 1024 first calibrates on an individual sub-group basis, using the individual group sum feedbacks 1023, and then on an overall output basis, using the combined sum output 1025.

The DAC driver group 1006 can calibrate individual driver +/−$V_1$ rails by taking drivers in pairs, with the other drivers held in the off state. One driver of the driver pair receives the calibration data sequence input and the other driver receives the complement calibration data sequence input. The driver rails are adjusted until the group sum output becomes zero (null). One of the drivers is then retained as a reference and the other driver's input is zeroed and another driver receives the calibration data sequence (or complement). The new driver rails are adjusted until the group sum output again becomes zero (null). The process continues until all group inputs are balanced.

Based on the reference +/−$V_1$ values, values for +/−$V_2$ and +/−$V_3$ are calculated and used for the reference levels for groups 1008 and 1010. The other two groups are calibrated according to the described group calibration procedure. The group to group calibration is then done using the combined sum output 1025 as the nulling port.

If it can be established that V1 is an integer multiple of $V_2$ and $V_3$, $X_2$ and $X_3$ for example, then the $V_2$ reference can be tweaked by applying the calibration data sequence to $X_2$ group 1008 inputs, and the complement data sequence to the reference group 1006 input. Similarly, the $V_3$ reference can be tweaked by applying the calibration data sequence to $X_3$ group 1010 inputs, and the complement data sequence to the reference group 1006 input.

Once the $V_x$ rails 1020 are calibrated, the sub-group calibration can be re-checked. If the number of sub-group multi-DACs 1006, 1008, 1010 and the scaling ratios are such as to preclude the convenient calibration method, then the unity weight summer 1012 can be scaled between sub-groups and used as a pre-scaler for the prescribed $V_x$ rails calibration.

Once the calibration-on-demand procedure is complete, the calibration can shift to on-line calibration. Patterns are looked for in the transmit data, resulting in null conditions at 1023 and 1025 as appropriate, and the appropriate DAC driver rails are "nudged" in the direction that creates a better null condition.

Several major benefits are gained by using linearized, Nyquist response restoring delta-sigma based multi-DACs as RF Power DAC transmitters. First, for example, the only devices that are high power are the tri-state multi-DACs 808, 810, 1006, 1008, 1010, the unity weight output summer 812, 1012 and the reconstruction analog filter 814, 1026. The output summer 812, 1012 and analog reconstruction filter 814, 1026 are passive and quite linear, to suppress distortion product generation. The tri-state multi-DACs are switched saturated amplifiers for high efficiency and low individual amplifier power (multiple lower power outputs summed together for a higher power output). The amplifier output level adjustment can be through individual +/−V power supply rails 1020, which are efficient DC outputs. Besides linearity control and amplitude scaling, the adjustable rails 1020 can be used to incorporate automatic/manual transmitter gain control (A/M TGC).

Second, the modulation signal remains in effectively high resolution, low noise and low distortion digital form all the way to the final passive unity weight summer 1012. As such the power of digital signal processing can be used to the fullest extent. No longer must transmitted signals be single tone because the transmitter's linearity is insufficient to support simultaneous multi-tone outputs without creating and radiating distortion products. Further, simultaneous transmit and receive operation at the same location is easier to implement because of the very low noise and distortion of the transmitted output.

Third, since the multi-DACs' summed output 1028 is of low noise and low distortion all the way up to the Nyquist frequency, the reconstruction filter 1026 requirements are greatly reduced. This also means that multiple signals can be combined in the digital modulation input such that simultaneous transmissions can occur in different frequency bands (simultaneous signals in HF, VHF, and UHF, for example). This can normally reduce the number of different transmitters as well as the total number of transmitters required at a location. Further, the frequency span above the Nyquist frequency (inverted bands up to the sample rate) can be used for transmission as well, as long as the input modulation and the reconstruction filtering is compatible with the image folding around the Nyquist frequency that occurs with any real sampled signals.

In addition to the digital radio context, the present inventions have utility in a wide range of other applications. For example, the present inventions can be used in multi-mode and fused aperture equipment, surveillance equipment, bioelectric equipment, and test equipment (including RF testing equipment). Further, the present inventions can be used in numerous commercial and consumer products requiring high performance analog-to-digital and digital-to-analog processing.

It is thought that the method and apparatus of the present invention will be understood from the description provided throughout this specification and the appended claims, and that it will be apparent that various changes may be made in the form, construct steps and arrangement of the parts and steps thereof, without departing from the spirit and scope of the invention or sacrificing all of their material advantages. The forms herein described are merely exemplary embodiments thereof.

What is claimed is:

1. A high pass delta-sigma modulator based signal converter apparatus, comprising:
    a differentiator component, comprising a differentiator component input and a differentiator component output;
    a signal transducer, comprising a signal transducer input and a signal transducer output, said signal transducer input coupled with said differentiator component output;
    a summer component, coupled between said differentiator component output and said signal transducer input; and
    an inverse signal transducer, comprising an inverse signal transducer input and an inverse signal transducer output, said inverse signal transducer input coupled with said signal transducer output, said inverse signal transducer output coupled with said summer component;
    wherein said inverse signal transducer is part of a feedback loop coupling output from said signal transducer back to said summer component.

2. The high pass delta-sigma modulator based signal converter apparatus according to claim 1, further comprising:
    a gain element coupled between said inverse signal transducer and said summer component; and
    an output signal delay structure coupled between said signal transducer and said inverse signal transducer.

3. The high pass delta-sigma modulator based signal converter apparatus according to claim 2, wherein said differentiator component further comprises a differentiator stage, said differentiator stage comprising:
    a differentiator stage delay structure comprising a differentiator stage delay structure input and a differentiator stage delay structure output, said differentiator stage delay structure input coupled with said differentiator component input;
    a differentiator stage calibration component, comprising a differentiator stage calibration component input and a differentiator stage calibration component output, said differentiator stage calibration component input coupled with differentiator stage delay structure output; and
    a differentiator stage subtractor, comprising a differentiator stage subtractor first input, a differentiator stage subtractor second input, and a differentiator stage subtractor output, said differentiator stage subtractor first input coupled with said differentiator component input, said differentiator stage subtractor second input coupled with said differentiator stage calibration component output, and said differentiator stage subtractor output coupled with said summer component;
    wherein signals received by said differentiator stage subtractor first input are added, and signals received by said differentiator stage subtractor second input are subtracted by said differentiator stage subtractor.

4. The high pass delta-sigma modulator based signal converter apparatus according to claim 3, wherein said differentiator component comprises a plurality of cascaded differentiator and summer combination stages, each said differentiator stage comprising a respective gain component, a respective delay component, and a respective subtractor component, each said summer stage coupled with said inverse signal transducer via its said respective gain component.

5. The high pass delta-sigma modulator based signal converter apparatus according to claim 3, wherein said differentiator component is capable of receiving an analog input signal via said differentiator component input, wherein said signal transducer comprises an analog-to-digital quantizer; and wherein said inverse signal transducer comprises a digital-to-analog converter.

6. The high pass delta-sigma modulator based signal converter apparatus according to claim 5, further comprising an output signal delay structure coupled with said signal transducer, said output signal delay structure comprising a first clock-phase digital latch component coupled with said signal transducer output, and a second clock-phase digital latch component coupled between said first clock-phase digital latch component and said inverse signal transducer; and
    said differentiator stage delay structure further comprising a first clock-phase sample-and-hold component coupled with said differentiator component input, and a second clock-phase sample-and-hold component coupled between said first clock-phase sample-and-hold component and said differentiator stage calibration component.

7. The high pass delta-sigma modulator based signal converter apparatus according to claim 5, further comprising a demultiplexer coupled to said analog-to-digital quantizer.

8. The high pass delta-sigma modulator based signal converter apparatus according to claim 3, wherein said differentiator component is capable of receiving a digital input signal via said differentiator component input, wherein said signal transducer comprises a digital resolution reducer, and wherein said inverse signal transducer comprises a digital resolution expander.

9. The high pass delta-sigma modulator based signal converter apparatus according to claim 8, further comprising an output signal delay structure coupled with said signal transducer, said output signal delay structure comprising a first clock-phase digital latch component coupled with said signal transducer output and a second clock-phase digital latch component coupled between said first clock-phase digital latch component and said inverse signal transducer; and
    said differentiator stage delay structure further comprising a first clock-phase digital latch component coupled with said differentiator component input, and a second clock-phase digital latch component coupled between said first clock-phase digital latch component and said differentiator stage calibration component.

10. The high pass delta-sigma modulator based signal converter apparatus according to claim 8, further comprising a demultiplexer coupled with said signal transducer.

11. The high pass delta-sigma modulator based signal converter apparatus according to claim 3, wherein said differentiator component is capable of receiving a digital input signal via said differentiator component input, wherein said signal transducer comprises a digital-to-analog transducer, and wherein said inverse signal transducer comprises an analog-to-digital converter.

12. The high pass delta-sigma modulator based signal converter apparatus according to claim 11, further comprising an output signal delay structure coupled with said signal transducer, said output signal delay structure comprising a first clock-phase sample-and-hold component coupled with said signal transducer output, and a second clock-phase sample-and-hold component coupled between said first clock-phase sample-and-hold component and said inverse signal transducer; and said differentiator stage delay structure further comprising a first clock-phase digital latch component coupled with said differentiator component input, and a second clock-phase digital latch component coupled between said first clock-phase digital latch component and said differentiator stage calibration component.

13. A delta-sigma modulator based converter apparatus, comprising:

a first low pass modulator set, comprising;
a first signal transducer, comprising a first signal transducer input and a first signal transducer output,
a first delta-sigma modulator structure, comprising a first delta-sigma modulator structure input and a first delta-sigma modulator structure output, said first delta-sigma modulator structure output coupled with said first signal transducer input,
a first inverse signal transducer, comprising a first inverse signal transducer input and a first inverse signal transducer output, said first inverse signal transducer input coupled with said first signal transducer output, said first inverse signal transducer output coupled with said first delta-sigma modulator structure, wherein said first inverse signal transducer is part of a feedback loop coupling output from said first signal transducer back to said first delta-sigma modulator structure, and
a first noise signal generation component, comprising a first noise signal generation component first input, a first noise signal generation component second input, and a first noise signal generation component output, said first noise signal generation component first input coupled with said first inverse signal transducer output, said first noise signal generation component second input coupled with said first delta-sigma modulator structure output, wherein signals received via said first noise signal generation component first input are subtracted from signals received via said first noise signal generation component second input and resultant signals are transmitted via said first noise signal generation component output;
a first scaling component, comprising a first scaling component input and a first scaling component output, said first scaling component input coupled with said first noise signal generation component output; and
a high pass modulator set, comprising;
a second signal transducer, comprising a second signal transducer input and a second signal transducer output,
a second delta-sigma modulator structure, comprising a second delta-sigma modulator structure input and a second delta-sigma modulator structure output, said second delta-sigma modulator structure input coupled with said first scaling component output, and said second delta-sigma modulator structure output coupled with said second signal transducer input, and
a second inverse signal transducer, comprising a second inverse signal transducer input and a second inverse signal transducer output, said second inverse signal transducer input coupled with said second signal transducer output, said second inverse signal transducer output coupled with said second delta-sigma modulator structure, wherein said second inverse signal transducer is part of a feedback loop coupling output from said second signal transducer back to said second delta-sigma modulator structure.

14. The delta-sigma modulator based converter apparatus according to claim 13, further comprising a plurality of modulator sets, said plurality of modulator sets comprising alternating low pass and high pass modulator sets.

15. The delta-sigma modulator based converter apparatus according to claim 13, wherein said first delta-sigma modulator structure is capable of receiving an analog input signal via said first delta-sigma modulator structure input, said first signal transducer comprises a first analog-to-digital quantizer, and said first inverse signal transducer comprises a first digital-to-analog converter; and wherein said second delta-sigma modulator structure is capable of receiving an analog input signal via said second delta-sigma modulator structure input, said second signal transducer comprises a second analog-to-digital quantizer, and said second inverse signal transducer comprises a second digital-to-analog converter.

16. The delta-sigma modulator based converter apparatus according to claim 15, further comprising a digital post processing structure, comprising a post processing structure first input and a post processing structure second input, said post processing structure first input coupled with said first signal transducer output and said post processing structure second input coupled with said second signal transducer output, said digital post processing structure further comprising a post processing structure output.

17. The delta-sigma modulator based converter apparatus according to claim 13, further comprising:

a second noise signal generation component, comprising a second noise signal generation component first input, a second noise signal generation component second input, and a second noise signal generation component output, said second noise signal generation component first input coupled with said second inverse signal transducer output, said second noise signal generation component second input coupled with said second delta-sigma modulator structure output, wherein signals received via said second noise signal generation component first input are subtracted from signals received via said second noise signal generation component second input and resultant signals are transmitted via said second noise signal generation component output;
a second scaling component, comprising a second scaling component input and a second scaling component output, said second scaling component input coupled with said second noise signal generation component output; and
a second low pass modulator set, comprising;
a third signal transducer, comprising a third signal transducer input and a third signal transducer output,
a third delta-sigma modulator structure, comprising a third delta-sigma modulator structure input and a third delta-sigma modulator structure output, said third delta-sigma modulator structure input coupled with said second scaling component output, and said third delta-sigma modulator structure output coupled with said third signal transducer input, and a third inverse signal transducer, comprising a third inverse signal transducer input and a third inverse signal transducer output, said third inverse signal transducer input coupled with said third signal transducer output, said third inverse signal transducer output coupled with said third delta-sigma modulator structure, wherein said third inverse signal transducer is part of a feedback loop coupling output from said third signal transducer back to said third delta-sigma modulator structure.

18. The delta-sigma modulator based converter apparatus according to claim 17, wherein said first delta-sigma modulator structure is capable of receiving an analog input signal via said first delta-sigma modulator structure input, said first signal transducer comprises a first analog-to-digital quantizer, said first inverse signal transducer comprises a first digital-to-analog converter;

wherein said second delta-sigma modulator structure is capable of receiving an analog input signal via said second delta-sigma modulator structure input, said second signal transducer comprises a second analog-to-digital quantizer, and said second inverse signal transducer comprises a second digital-to-analog converter; and wherein said third delta-sigma modulator structure is capable of receiving an analog input signal via said third delta-sigma modulator structure input, said third signal transducer comprises a third analog-to-digital quantizer, and said third inverse signal transducer comprises a third digital-to-analog converter.

19. The delta-sigma modulator based converter apparatus according to claim 18, further comprising a digital post processing structure, comprising a post processing structure first input, a post processing structure second input and a post processing structure third input, said post processing structure first input coupled with said first signal transducer output, said post processing structure second input coupled with said second signal transducer output, and said post processing structure third input coupled with said third signal transducer output, said digital post processing structure further comprising a post processing structure output.

20. The delta-sigma modulator based converter apparatus according to claim 17, wherein said first delta-sigma modulator structure component is capable of receiving a digital input signal via said first delta-sigma modulator structure component input, wherein said first signal transducer comprises a first digital resolution reducer, wherein said second signal transducer comprises a second digital resolution reducer, wherein said third signal transducer comprises a third digital resolution reducer, wherein said first inverse signal transducer comprises a first digital resolution expander, wherein said second inverse signal transducer comprises a second digital resolution expander, and wherein said third inverse signal transducer comprises a third digital resolution expander.

21. The delta-sigma modulator based converter apparatus according to claim 20, further comprising a digital post processing structure, comprising a post processing structure first input, a post processing structure second input, and a post processing structure third input, said post processing structure first input coupled with said first signal transducer output, said post processing structure second input coupled with said second signal transducer output, and said post processing structure third input coupled with said third signal transducer output, said digital post processing structure further comprising a post processing structure output.

22. The delta-sigma modulator based converter apparatus according to claim 20, further comprising:

a first digital post processing structure, comprising a first digital post processing structure input and a first digital post processing structure output, said first digital post processing structure input coupled with said first signal transducer output;

a second digital post processing structure, comprising a second digital post processing structure input and a second digital post processing structure output, said second digital post processing structure input coupled with said second signal transducer output;

a third digital post processing structure, comprising a third digital post processing structure input and a third digital post processing structure output, said third digital post processing structure input coupled with said third signal transducer output;

a first digital-to-analog converter, comprising a first digital-to-analog converter input and a first digital-to-analog converter output, said first digital-to-analog converter input coupled with said first digital post processing structure output;

a second digital-to-analog converter, comprising a second digital-to-analog converter input and a second digital-to-analog converter output, said second digital-to-analog converter input coupled with said second digital post processing structure output;

a third digital-to-analog converter, comprising a third digital-to-analog converter input and a third digital-to-analog converter output, said third digital-to-analog converter input coupled with said third digital post processing structure output;

a first gain adjustment component, comprising a first gain adjustment component input and a first gain adjustment component output, said first gain adjustment component input coupled with said first digital-to-analog converter output;

a second gain adjustment component, comprising a second gain adjustment component input and a second gain adjustment component output, said second gain adjustment component input coupled with said second digital-to-analog converter output; and a third gain adjustment component, comprising a third gain adjustment component input and a third gain adjustment component output, said third gain adjustment component input coupled with said third digital-to-analog converter output; and a combiner, comprising a combiner first input, a combiner second input, a combiner third input and a combiner output, said combiner first input coupled with said first gain adjustment component output, said combiner second input coupled with said second gain adjustment component output and said combiner third input coupled with said third gain adjustment component output.

23. The delta-sigma modulator based converter apparatus according to claim 13, wherein said first delta-sigma modulator structure component is capable of receiving a digital input signal via said first delta-sigma modulator structure component input, wherein said first signal transducer comprises a first digital resolution reducer, wherein said second signal transducer comprises a second digital resolution reducer, wherein said first inverse signal transducer comprises a first digital resolution expander, and wherein said second inverse signal transducer comprises a second digital resolution expander.

24. The delta-sigma modulator based converter apparatus according to claim 23, further comprising a digital post processing structure, comprising a post processing structure first input and a post processing structure second input, said post processing structure first input coupled with said first signal transducer output and said post processing structure second input coupled with said second signal transducer output, said digital post processing structure further comprising a post processing structure output.

25. The delta-sigma modulator based converter apparatus according to claim 23, further comprising:
- a first digital post processing structure, comprising a first digital post processing structure input and a first digital post processing structure output, said first digital post processing structure input coupled with said first signal transducer output;
- a second digital post processing structure, comprising a second digital post processing structure input and a second digital post processing structure output, said second digital post processing structure input coupled with said second signal transducer output;
- a first digital-to-analog converter, comprising a first digital-to-analog converter input and a first digital-to-analog converter output, said first digital-to-analog converter input coupled with said first digital post processing structure output;
- a second digital-to-analog converter, comprising a second digital-to-analog converter input and a second digital-to-analog converter output, said second digital-to-analog converter input coupled with said second digital post processing structure output;
- a first gain adjustment component, comprising a first gain adjustment component input and a first gain adjustment component output, said first gain adjustment component input coupled with said first digital-to-analog converter output;
- a second gain adjustment component, comprising a second gain adjustment component input and a second gain adjustment component output, said second gain adjustment component input coupled with said second digital-to-analog converter output; and
- a combiner, comprising a combiner first input, a combiner second input and a combiner output, said combiner first input coupled with said first gain adjustment component output, and said combiner second input coupled with said second gain adjustment component output.

26. A method for processing an analog signal and outputting a digital signal, comprising the steps of:
- inputting an analog signal into a differentiator component of a high pass modulator set;
- processing the analog signal by passing it through at least one differentiator component followed by a summer component;
- transferring the processed analog signal from said summer component to a signal transducer;
- converting the processed analog signal into a transducer processed digital signal;
- re-converting the transducer processed digital signal to an analog feedback signal;
- feeding the analog feedback signal back to the summer component; and
- outputting the transducer processed digital signal from the high pass modulator set.

27. The method of claim 26, wherein said processing step comprises passing the analog signal through a plurality of cascaded differentiator stages and through a summer located after each differentiator stage in the cascade.

28. The method of claim 27, further comprising the steps of:
- adjusting the gain of the analog feedback signal before feeding it back; and
- summing, after each differentiator stage, the analog signal with the gain adjusted analog feedback signal.

29. A signal converter apparatus, comprising:
- first low pass modulator set means for filtering an input signal and outputting a first noise signal and a first data signal;
- first scaling component means for scaling the first noise signal and outputting a scaled first noise signal; and
- high pass modulator set means for filtering the scaled first noise signal and outputting a second noise signal and a second data signal.

30. The converter apparatus of claim 29, further comprising:
- second scaling component means for scaling the second noise signal and outputting a scaled second noise signal;
- second low pass modulator set means for filtering the scaled second noise signal and outputting a third noise signal and a third data signal;
- digital post processing means for processing the second data signal and the third data signal;
- first combiner means for combining the first data signal and the second data signal and for outputting a first combined signal; and
- second combiner means for combining the first combined signal and the third data signal and for outputting a second combined signal.

* * * * *